United States Patent [19]

Nakagawa et al.

[11] Patent Number: 5,994,739
[45] Date of Patent: *Nov. 30, 1999

[54] INTEGRATED CIRCUIT DEVICE

[75] Inventors: Akio Nakagawa, Hiratsuka; Tsuneo Ogura, Yokohama, both of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/478,654

[22] Filed: Jun. 7, 1995

Related U.S. Application Data

[63] Continuation-in-part of application No. 08/191,132, Jan. 24, 1994, Pat. No. 5,477,065, which is a continuation of application No. 07/724,931, Jul. 2, 1991, abandoned.

[30] Foreign Application Priority Data

| Jul. 2, 1990 | [JP] | Japan | 2-172706 |
| Apr. 11, 1991 | [JP] | Japan | 3-079026 |

[51] Int. Cl.⁶ .................................................. H01L 27/01
[52] U.S. Cl. .......................... 257/350; 257/370; 257/378; 257/557
[58] Field of Search .................................. 257/350, 370, 257/378, 557, 343

[56] References Cited

U.S. PATENT DOCUMENTS

| 4,050,965 | 9/1977 | Ipri et al. | 257/350 |
| 4,419,685 | 12/1983 | Sugawara et al. | 257/557 |
| 4,897,698 | 1/1990 | Zorinsky et al. | 257/526 |
| 4,965,872 | 10/1990 | Vasudev | 257/350 |
| 5,075,737 | 12/1991 | Shinohara | 257/349 |
| 5,212,397 | 5/1993 | See et al. | 257/350 |
| 5,477,065 | 12/1995 | Nakagawa et al. | 257/146 |

FOREIGN PATENT DOCUMENTS

| 0 137 992 | 4/1985 | European Pat. Off. . |
| 0 138 563 | 4/1985 | European Pat. Off. . |
| 0 180 363 | 5/1986 | European Pat. Off. . |
| 60100469 | 6/1985 | Japan . |
| 02003238 | 1/1990 | Japan . |

*Primary Examiner*—Mark V. Prenty
*Attorney, Agent, or Firm*—Oblon, Spivak, McClelland, Maier & Neustadt, P.C.

[57] ABSTRACT

An integrated circuit device comprising an active layer of a first conductivity type insulatively disposed over a semiconductor substrate, a lateral bipolar transistor fabricated in the active layer, the lateral bipolar transistor comprising a first base layer of a second conductivity type which is formed in the active layer, an emitter layer of the first conductivity, and a collector of the first conductivity which is formed in the active layer on a lateral side of the first base layer, a MOS transistor fabricated in the active layer, the MOS transistor comprising a second base layer of the second conductivity type, a source layer of the first conductivity type which is formed in the second base layer, a drain layer of the first conductivity type which is formed in the active layer, and a gate electrode insulatively disposed over the second base layer between the source layer and the drain layer, and an isolation layer formed in the active layer for separating the bipolar transistor and the MOS transistor from each other.

16 Claims, 34 Drawing Sheets

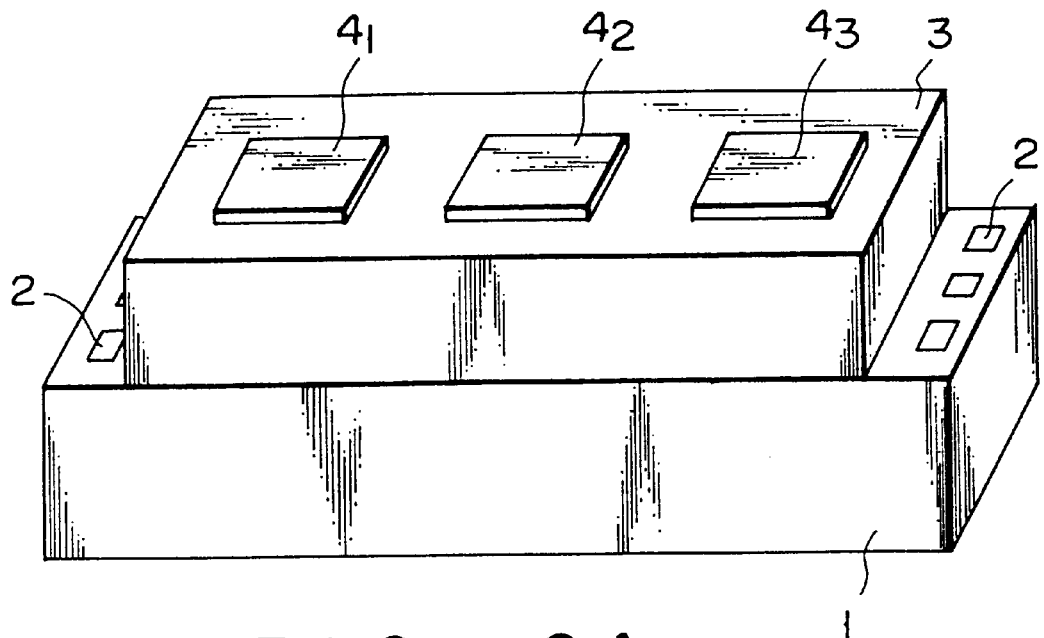
F I G. 2A
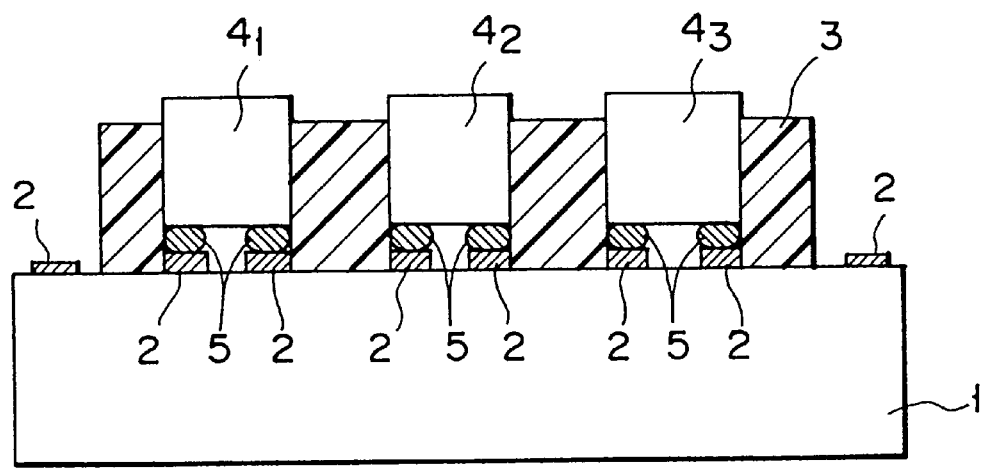
F I G. 2B

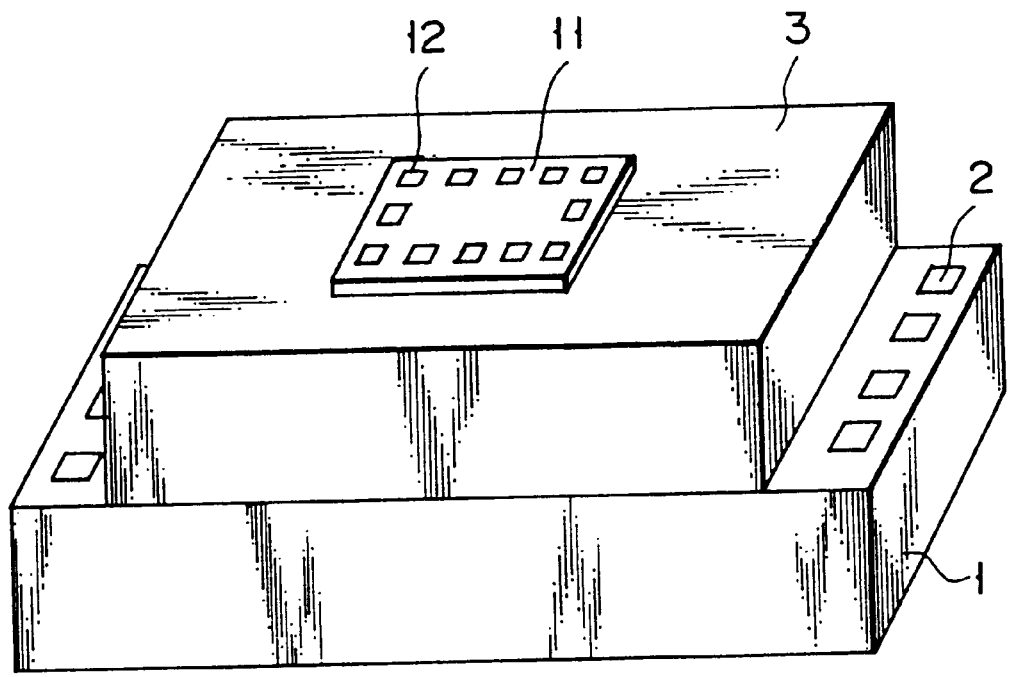
F I G. 4A
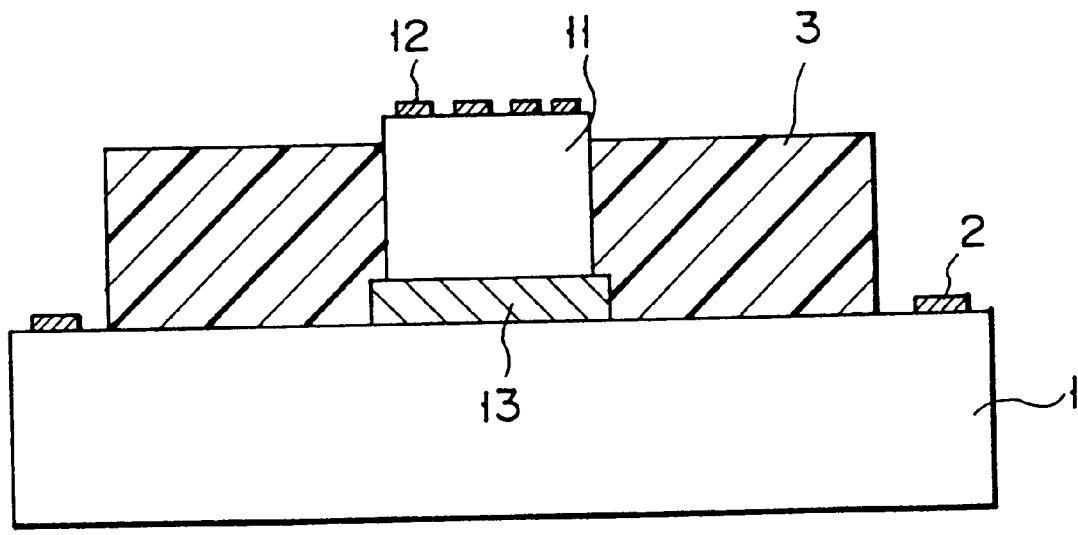
F I G. 4B

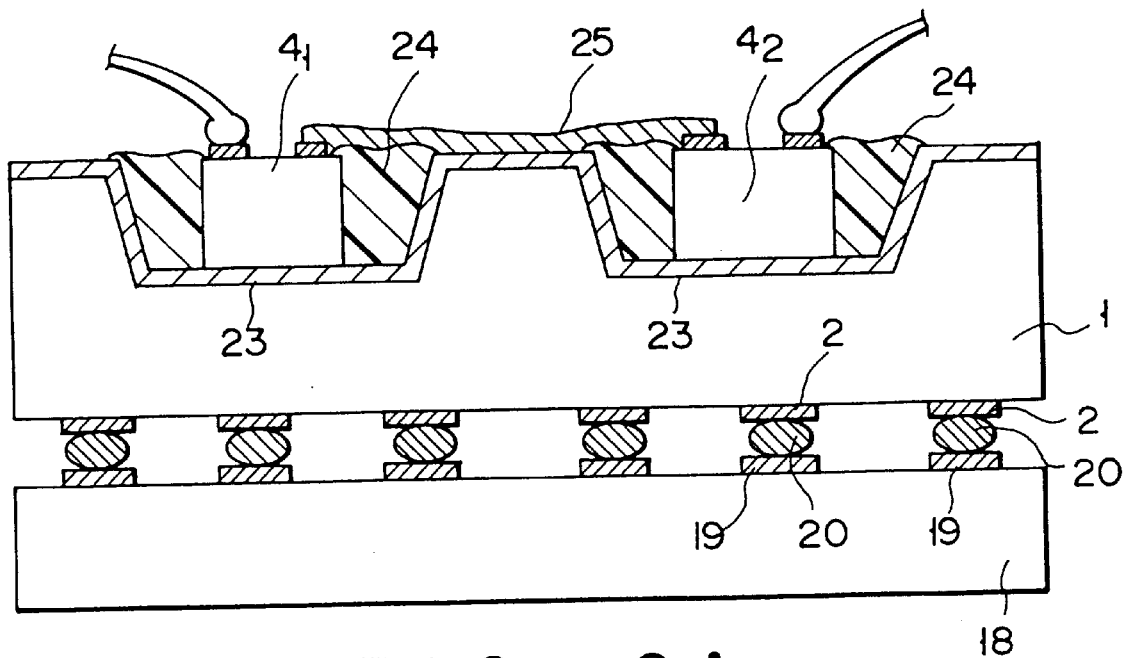
F I G. 9A
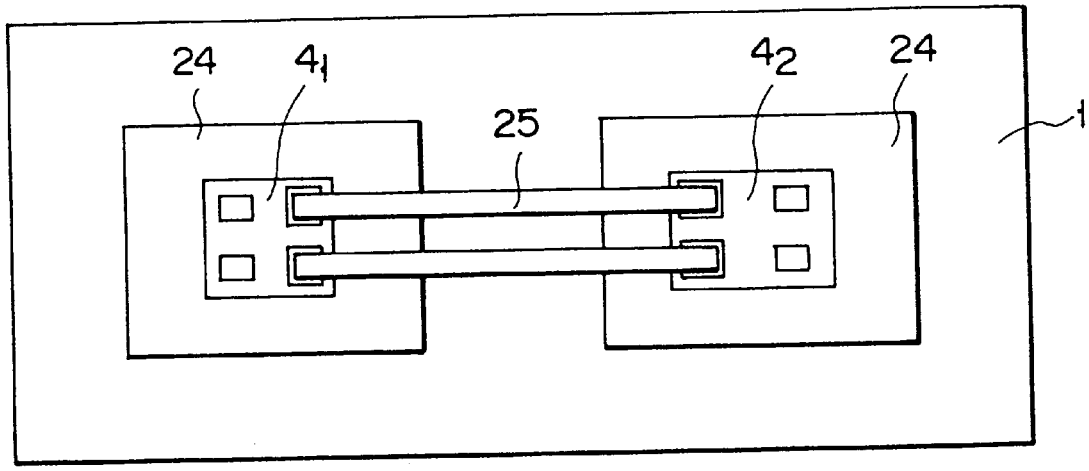
F I G. 9B

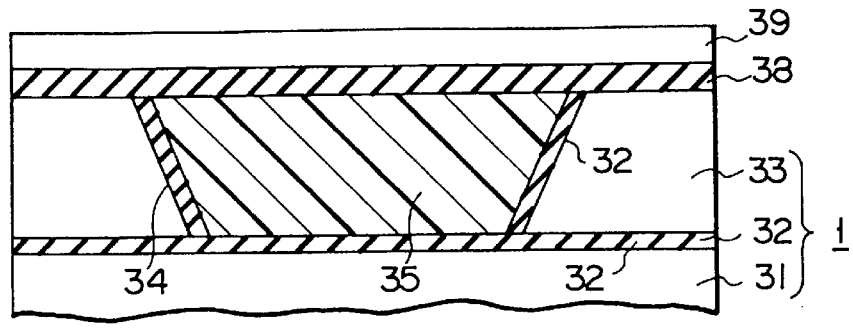
F I G. 12A
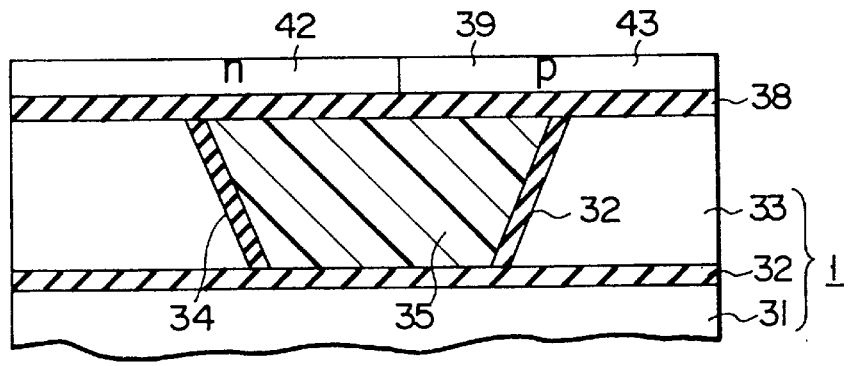
F I G. 12B
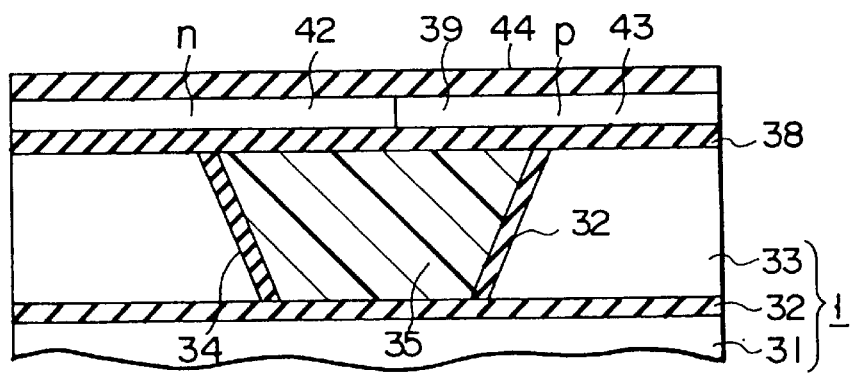
F I G. 12C

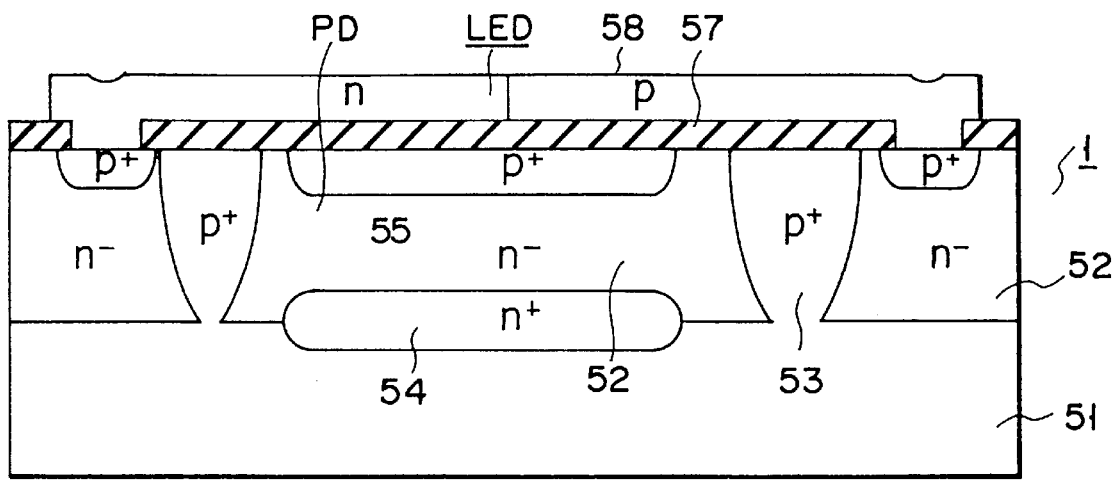
F I G. 13A
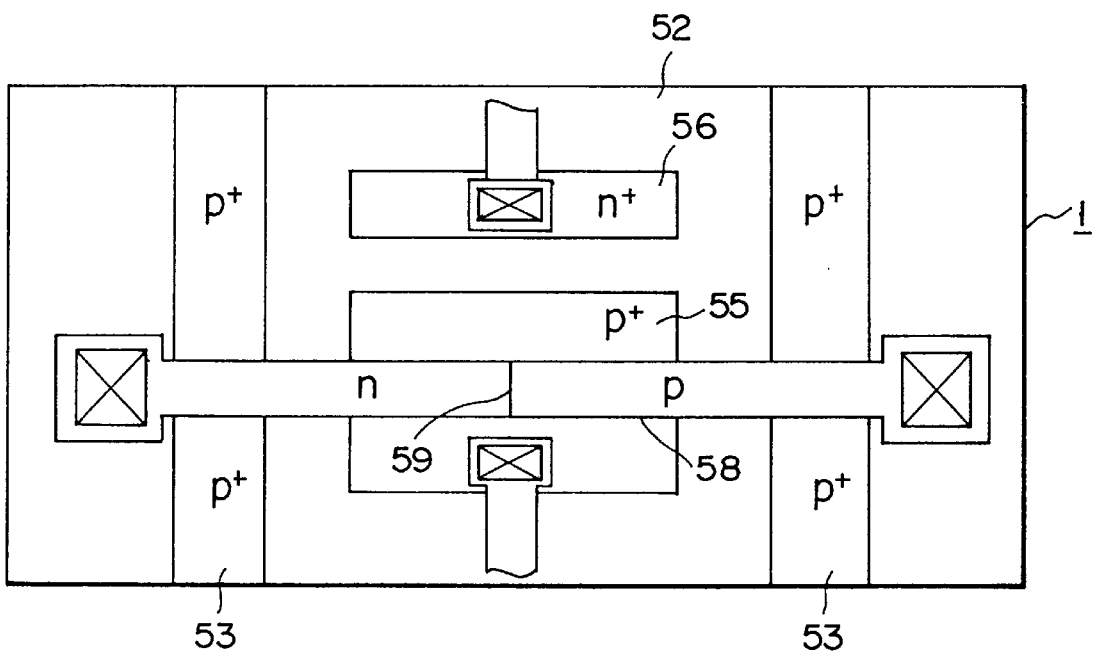
F I G. 13B

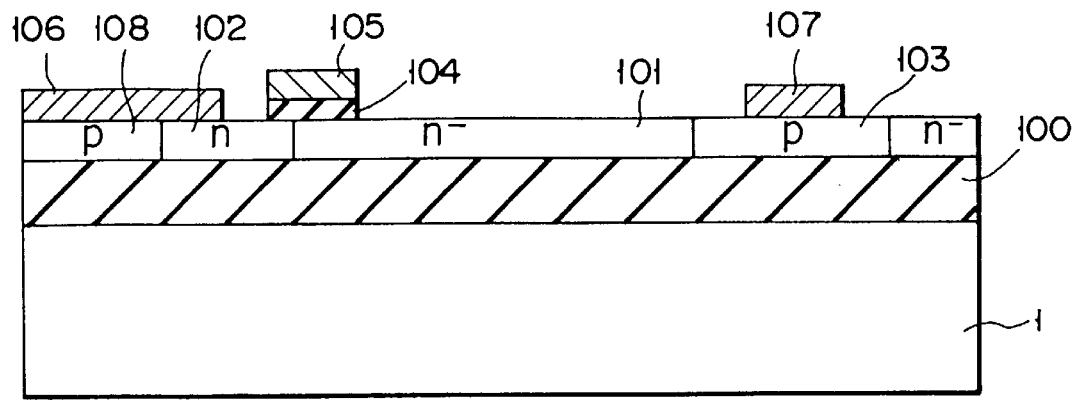
F I G. 19A
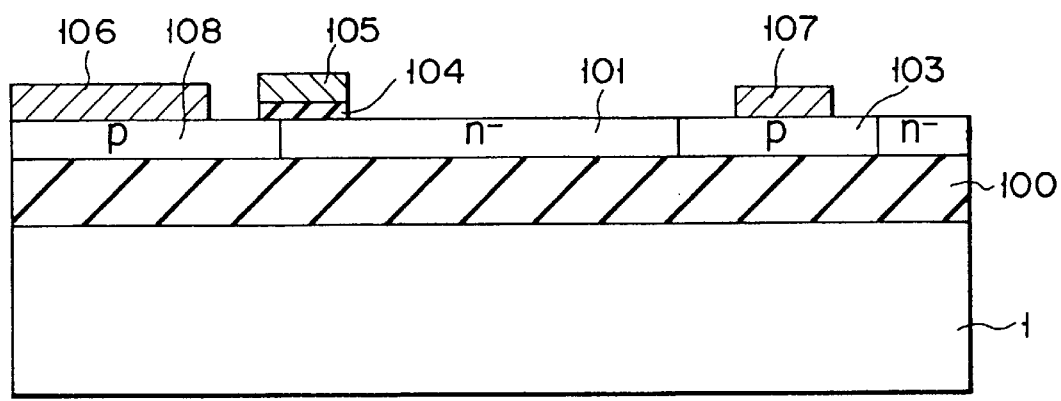
F I G. 19B
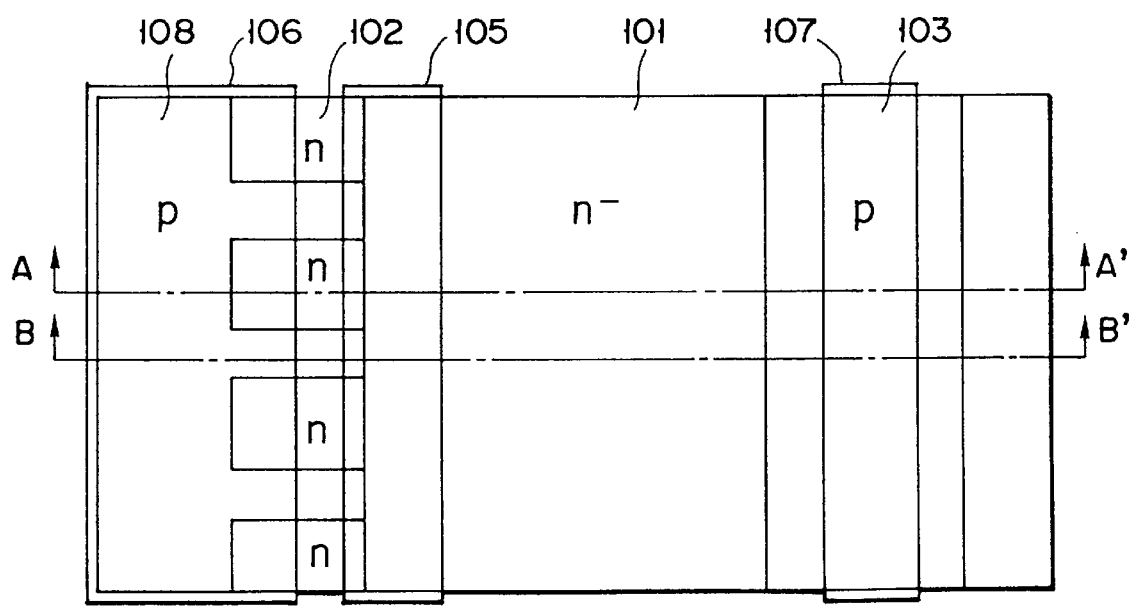
F I G. 19C

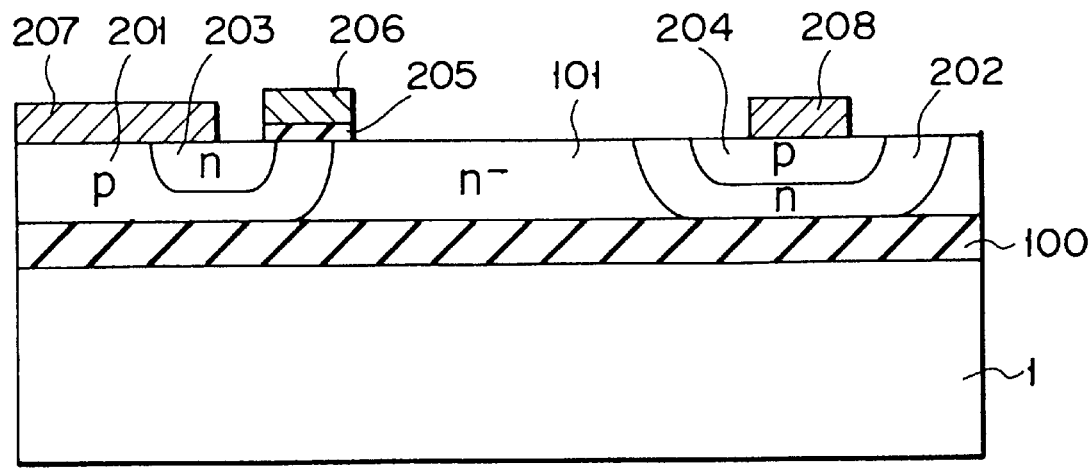
F I G. 20A
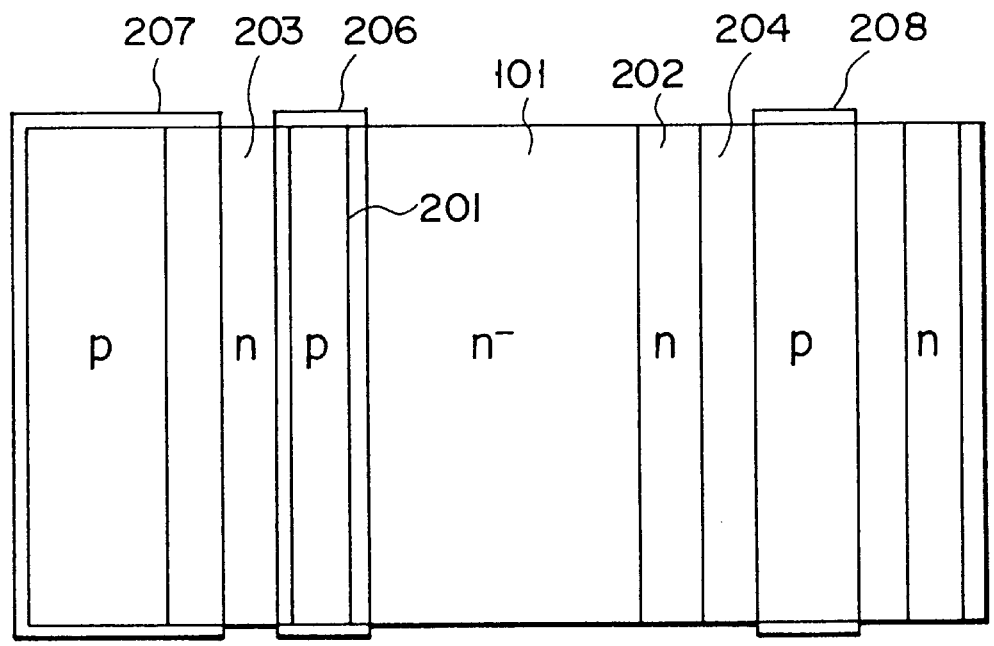
F I G. 20B

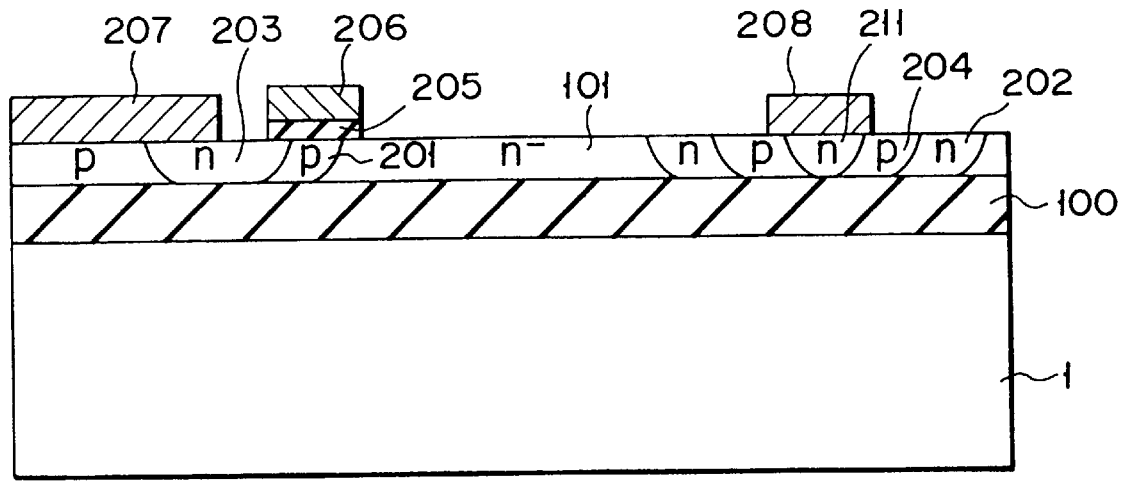
F I G. 23A
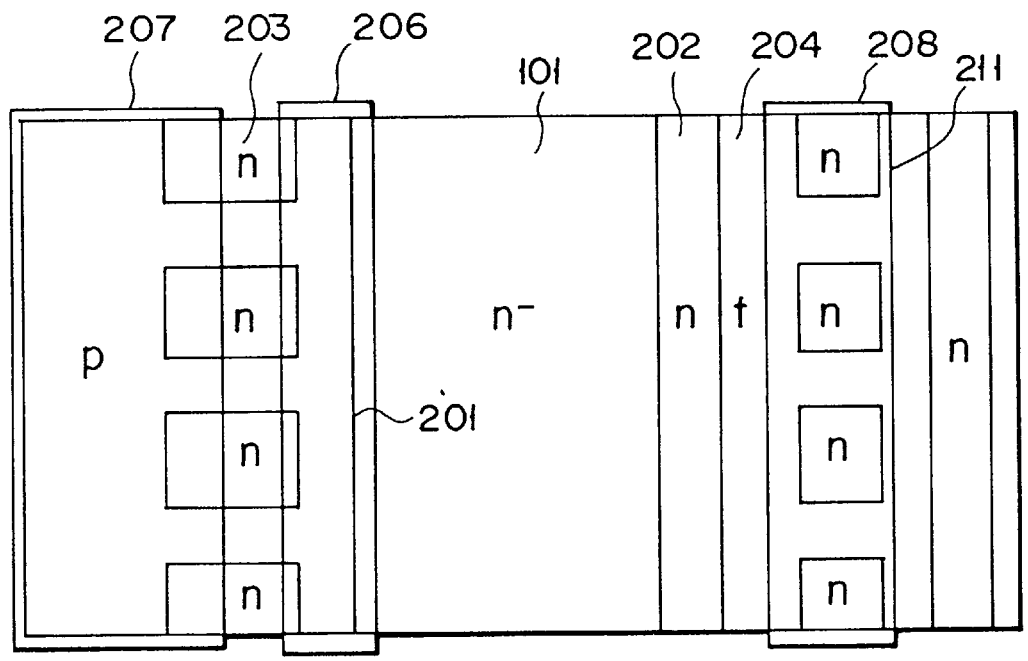
F I G. 23B

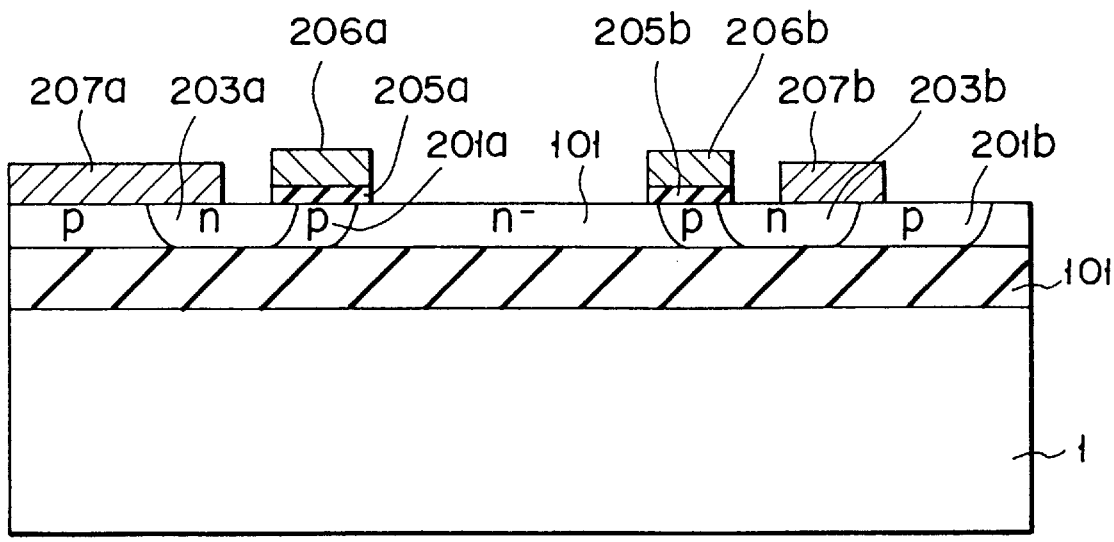
F I G. 24A
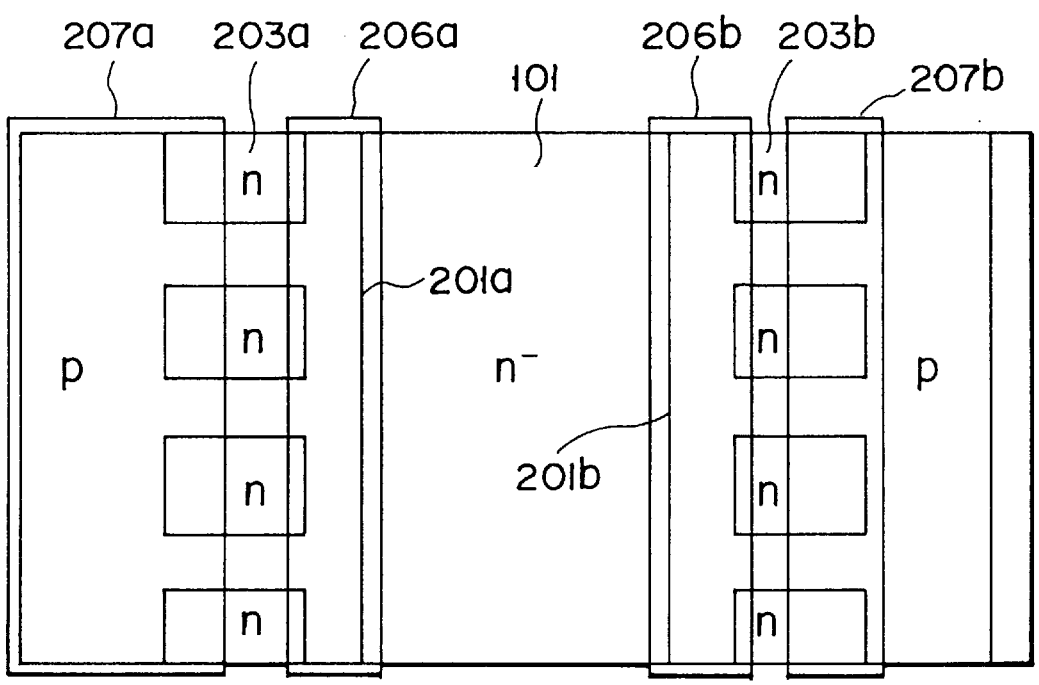
F I G. 24B

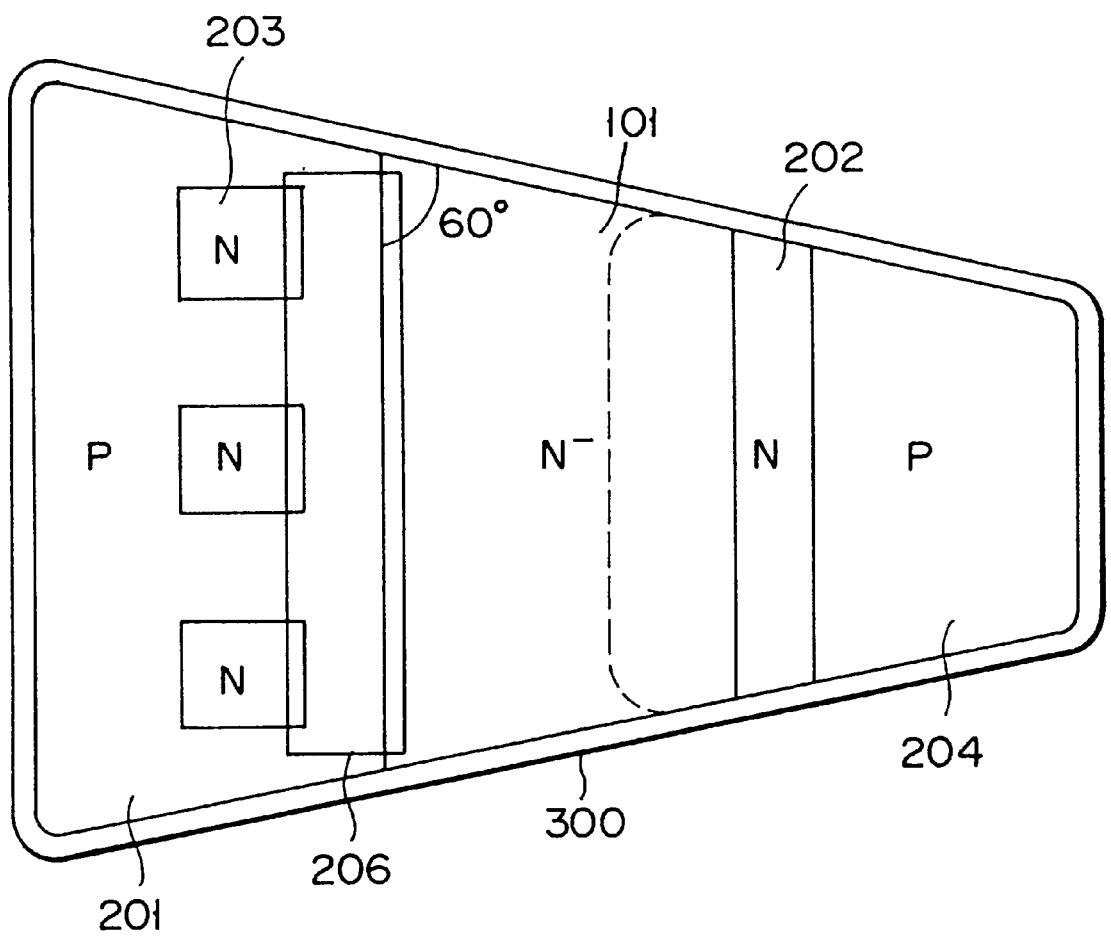
F I G. 25

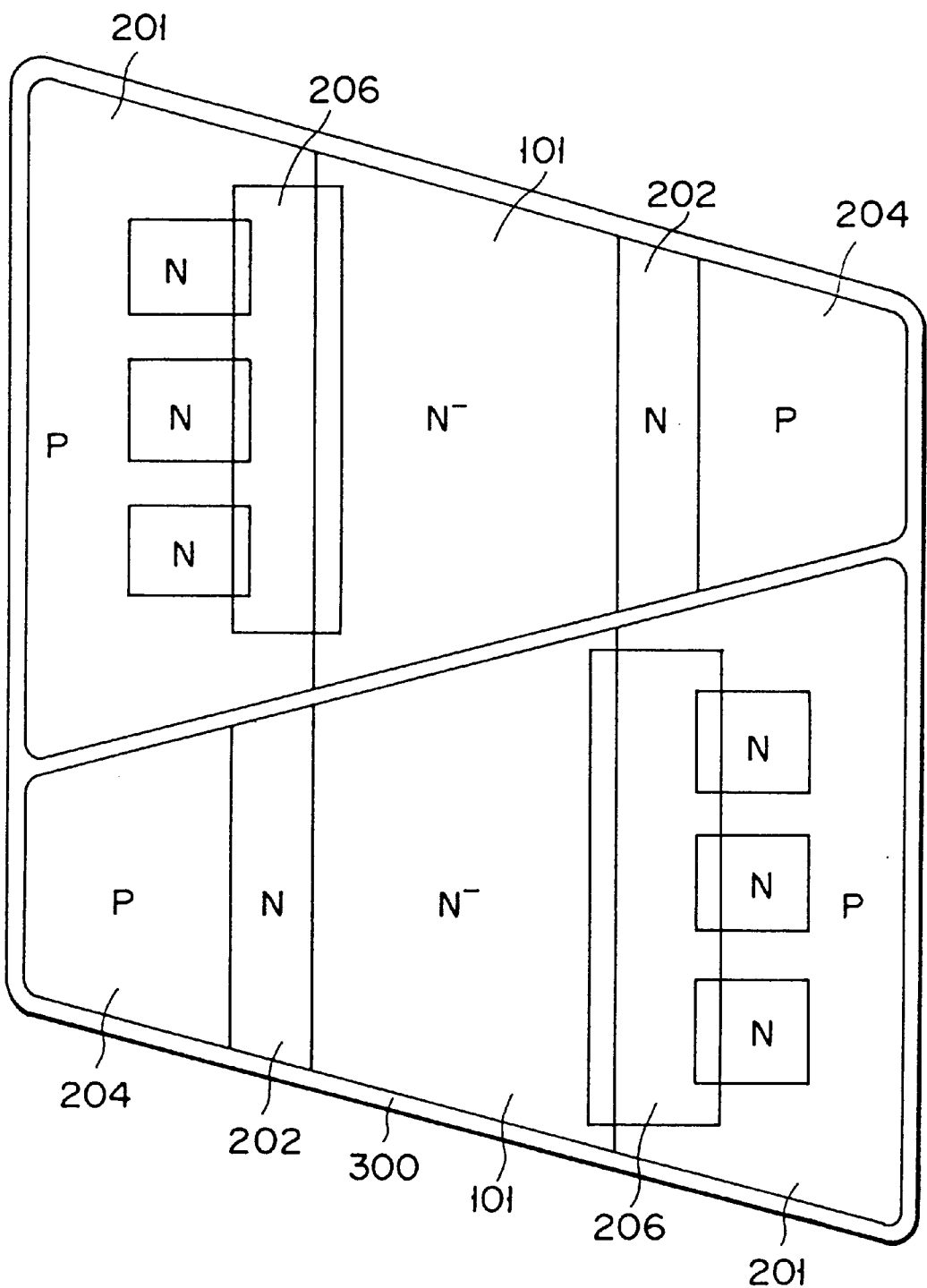
F I G. 26

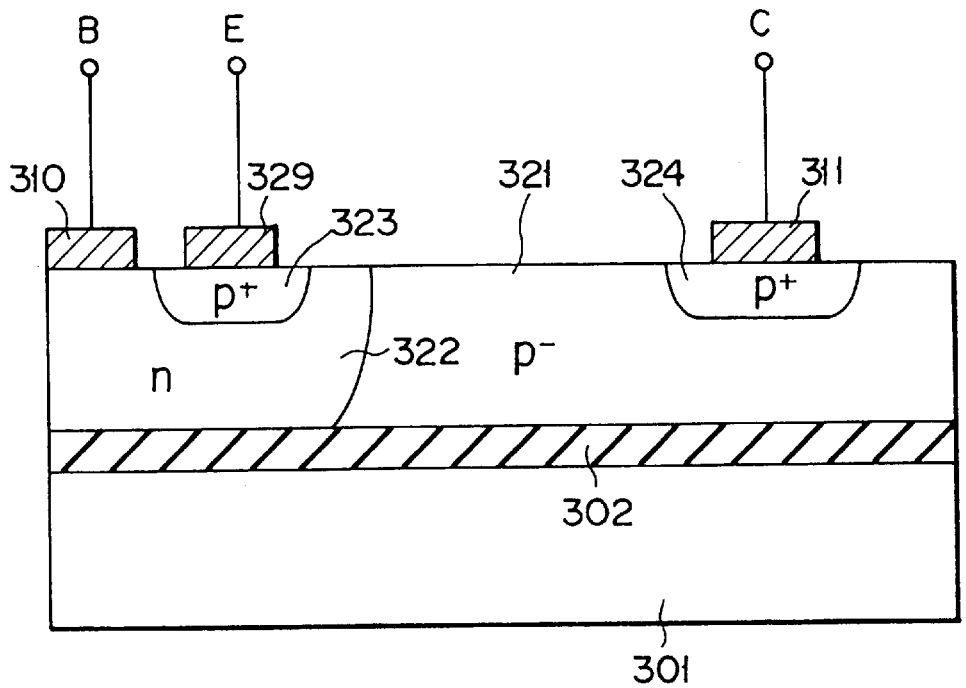
F I G. 31
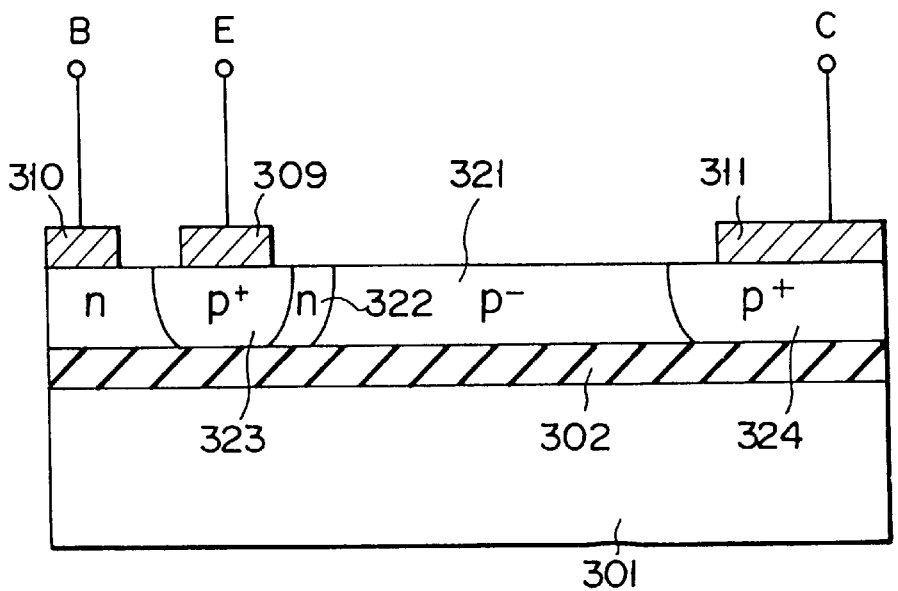
F I G. 32

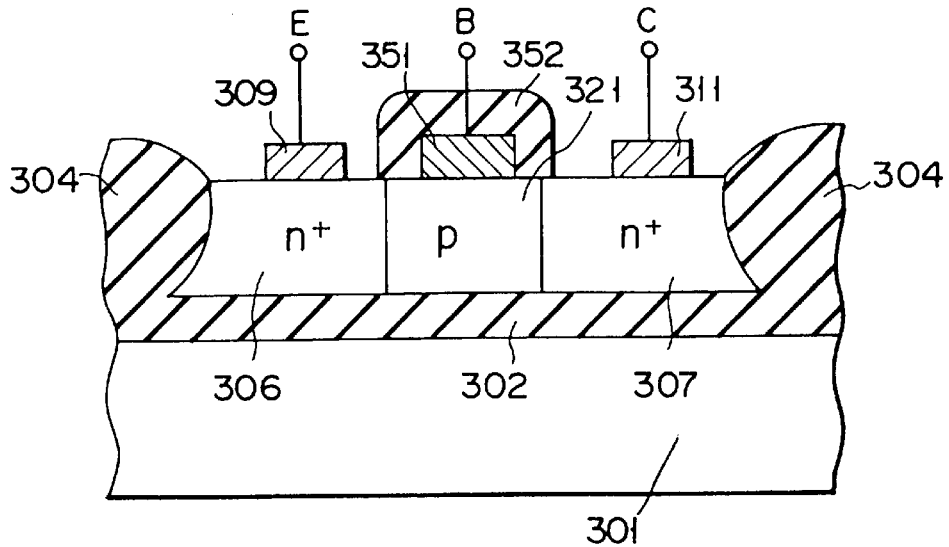
F I G. 36
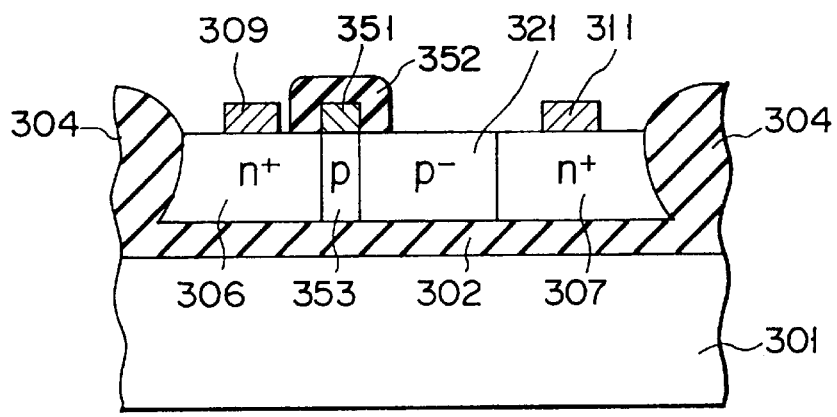
F I G. 38
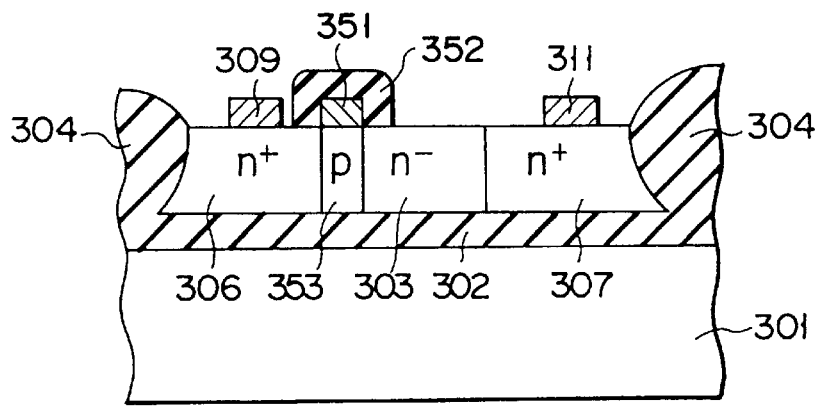
F I G. 39

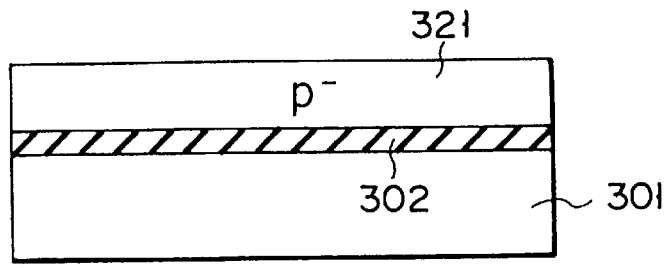
F I G. 37A
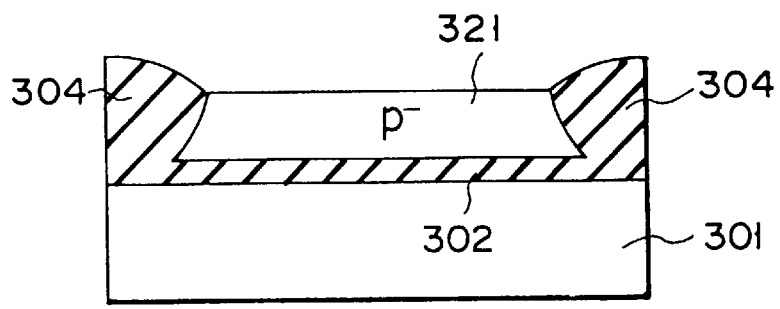
F I G. 37B
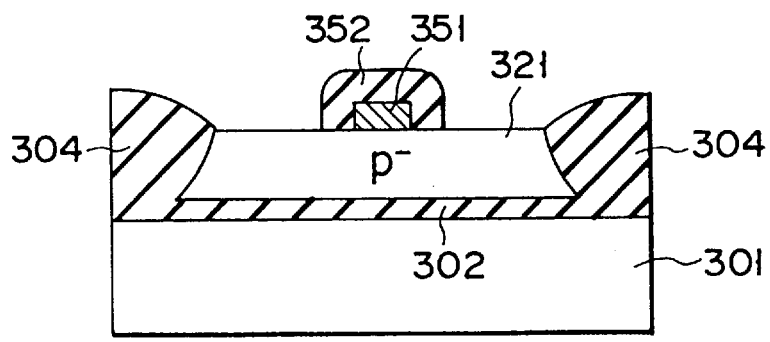
F I G. 37C
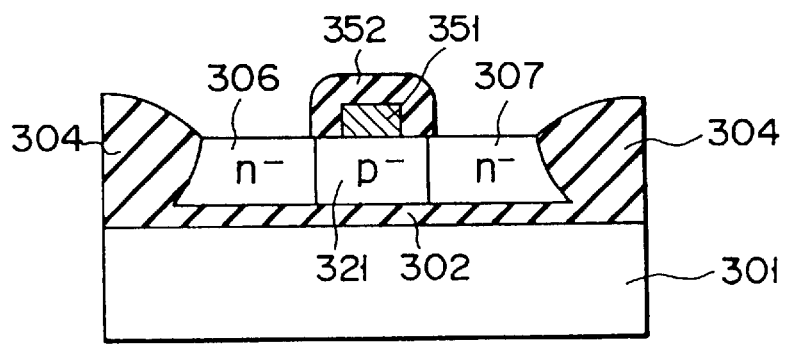
F I G. 37D

INTEGRATED CIRCUIT DEVICE

CROSS-REFERENCES TO THE RELATED APPLICATIONS

This is a continuation-in-part of prior application No. 08/191,132, filed Jan. 24, 1994 now U.S. Pat. No. 5,477,065, which is a continuation of U.S. patent application No. 07/724,931, filed Jul. 2, 1991, now abandoned.

BACKGROUND OF THE INVENTION

1. Field of the Invention

This invention relates to an integrated circuit device constructed by forming and integrating various types of electronic elements on a semiconductor chip and effectively used as a power integrated circuit.

2. Description of the Related Art

A monolithic semiconductor integrated circuit is formed by integrating transistors, resistors, diodes and the like in a 2-dimensional fashion on a silicon substrate. However, when such an integrated circuit is used as a power conversion circuit such as an inverter, it is difficult to make an output element with large current capacity and high withstand voltage and form the output element together with another element on one chip. Further, it is impossible to integrally form capacitors and inductances which are generally required for the power conversion circuit on a silicon chip. For this reason, in the prior art, a hybrid integrated circuit has been used as this type of power integrated circuit. However, since the hybrid integrated circuit is constructed by mounting various types of semiconductor element chips, resistors, capacitors and the like on a print circuit board or the like, problems that the occupied area increases, the wiring capacitance increases, the assembling process becomes complicated and the like occur. Further, there occurs a problem associated with radiation of a large amount of heat caused by high integration.

As described above, when the power integrated circuit is constructed by using the conventional integrated circuit technology, it is difficult to enhance the current capacity and withstand voltage of the output element in a monolithic integrated circuit and therefore a problem that the occupied area and the wiring capacitance may increase will occur in a hybrid integrated circuit, and in either case, a serious problem associated with heat radiation occurs.

SUMMARY OF THE INVENTION

An object of this invention is to provide a composite integrated circuit device capable of realizing an output element with a large current capacity and high withstand voltage, reducing the occupied area and wiring capacitance and improving the heat radiation property.

According to this invention, there is provided an integrated circuit device comprising:

a semiconductor substrate;

an active layer of a first conductivity type insulatively disposed over the semiconductor substrate;

a lateral bipolar transistor fabricated in the active layer, the lateral bipolar transistor comprising a first base layer of a second conductivity type which is formed in the active layer, an emitter layer of the first conductivity, and a collector of the first conductivity which is formed in the active layer on a lateral side of the first base layer;

a MOS transistor fabricated in the active layer, the MOS transistor comprising a second base layer of the second conductivity type, a source layer of the first conductivity type which is formed in the second base layer, a drain layer of the first conductivity type which is formed in the active layer, and a gate electrode insulatively disposed over the second base layer between the source layer and the drain layer; and an isolation layer formed in the active layer for separating the bipolar transistor and the MOS transistor from each other.

According to the present invention, there is provided an integrated circuit device comprising:

a semiconductor substrate;

an active layer of a first conductivity type insulatively disposed over the semiconductor substrate;

a plurality of lateral bipolar transistors fabricated in the active layer, the lateral bipolar transistors each comprising a base layer which is formed in the active layer, an emitter layer, and a collector which is formed in the active layer on a lateral side of the base layer; and an isolation layer formed in the active layer for separating the bipolar transistors from one another.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2A is a perspective view of a composite integrated circuit device according to a second embodiment;

FIG. 2B is a cross sectional view of the composite integrated circuit device shown in FIG. 2A;

FIG. 4A is a perspective view of a composite integrated circuit device according to a third embodiment;

FIG. 4B is a cross sectional view of the composite integrated circuit device shown in FIG. 4A;

FIG. 9A is a cross sectional view of a composite integrated circuit device according to an eighth embodiment;

FIG. 9B is a plan view of the composite integrated circuit device shown in FIG. 9A;

FIGS. 12A to 12E respectively show the cross sections of semiconductor structures in the respective manufacturing steps for the device of FIG. 11;

FIG. 13A is a cross sectional view of a composite integrated circuit device according to an eleventh embodiment;

FIG. 13B is a plan view of the composite integrated circuit device shown in FIG. 13A;

FIGS. 19A and 19B are cross sectional views of a composite integrated circuit device according to a sixteenth embodiment;

FIG. 19C is a plan view of the composite integrated circuit device of the sixteenth embodiment;

FIG. 20A is a cross sectional view of a composite integrated circuit device according to a seventeenth embodiment;

FIG. 20B is a plan view of the composite integrated circuit device shown in FIG. 20A;

FIG. 23A is a cross sectional view of a composite integrated circuit device according to a twentieth embodiment;

FIG. 23B is a plan view of the composite integrated circuit device shown in FIG. 23A;

FIG. 24A is a cross sectional view of a composite integrated circuit device according to a twenty-first embodiment;

FIG. 24B is a plan view of the composite integrated circuit device shown in FIG. 24A;

FIG. 25 is a view showing the layout of a whole IGBT of the embodiment of FIG. 21;

FIG. 26 is a plan view of a circuit device constructed by combining two IGBTs having the same construction as the IGBT shown in FIG. 25;

FIG. 31 is a cross sectional view of a third bipolar type semiconductor device;

FIG. 32 is a cross sectional view of a fourth bipolar type semiconductor device;

FIG. 36 is a cross sectional view of an eighth bipolar type semiconductor device;

FIGS. 37A to 37D are cross sectional views respectively showing semiconductor structures in the respective manufacturing steps for the element of FIG. 36;

FIG. 38 is a cross sectional view of a ninth bipolar type semiconductor device which is a modification of the bipolar type semiconductor device of FIG. 36;

FIG. 39 is a cross sectional view of a tenth bipolar type semiconductor device which is a modification of the bipolar type semiconductor device of FIG. 38.

DETAILED DESCRIPTION OF THE PREFERRED EMBODIMENTS

Figure 1A:
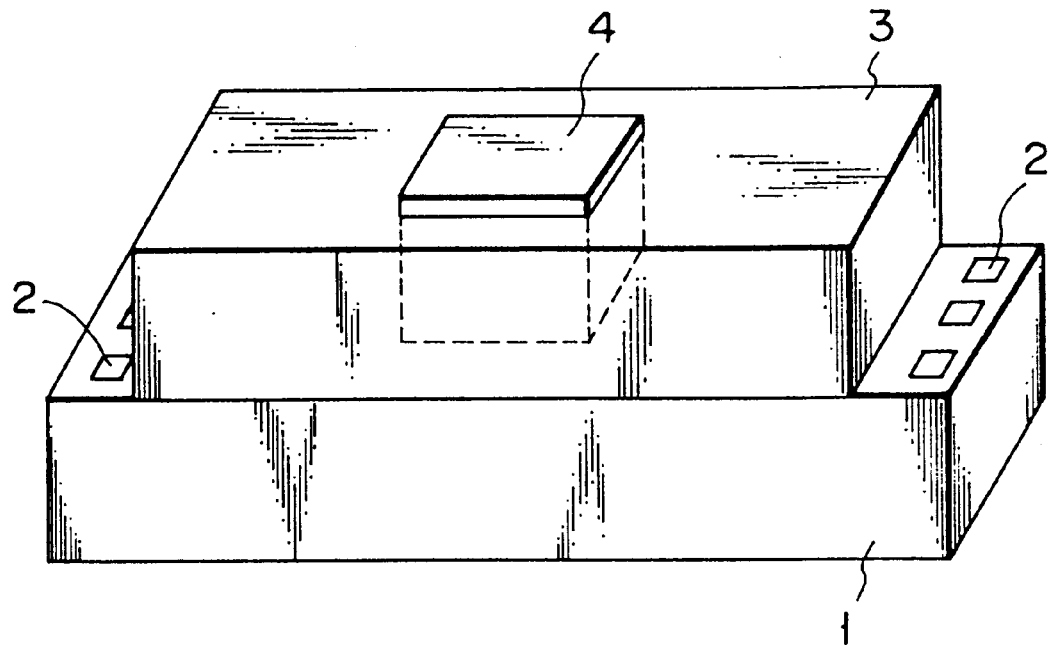
FIG. 1A is a perspective view of a composite integrated device according to a first embodiment of this invention.
Figure 1B:
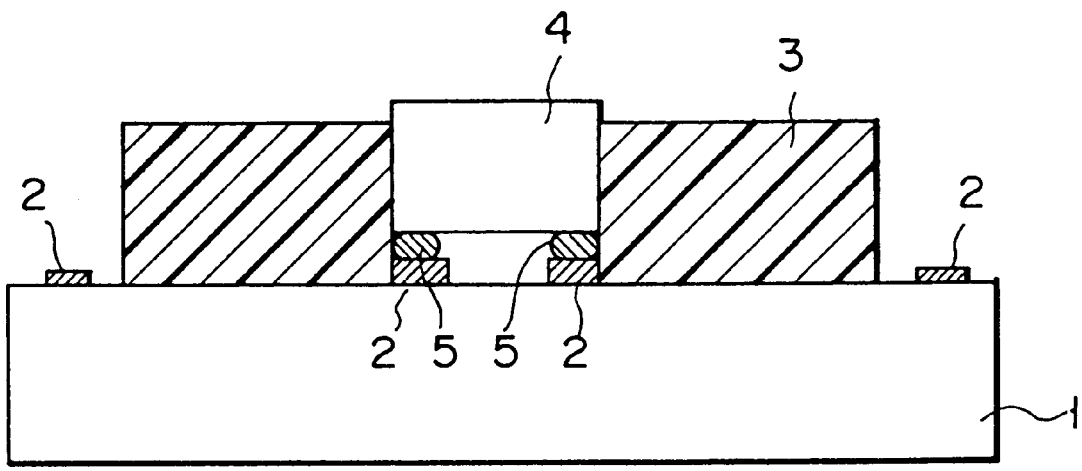
FIG. 1B is a cross sectional view of the composite integrated circuit device shown in FIG. 1A.

According to a first embodiment shown in FIGS. 1A and 1B, a semiconductor element chip 1 is a power element chip of high withstand voltage or an integrated circuit chip having transistors or diodes integrated thereon in a 2-dimensional fashion. As shown in FIGS. 1A and 1B, terminal electrodes 2 are formed on the semiconductor element chip 1. A positioning guide 3 formed of resin such as polyimide and having a guide hole formed in a preset position thereof is formed on the element chip 1 and an electronic element 4 is self-aligned in a preset position on the element chip 1 by use of the positioning guide 3 and mounted there.

The electronic element 4 is a semiconductor element chip having one or more elements formed thereon, or a capacitor, inductance element or the like. The electronic element 4 is connected to the terminal electrodes 2 on the semiconductor element chip 1 via bonding metal members 5 such as solder or bump electrodes.

The bonding metal members 5 are not always necessary if the electrode metal members of the electronic element 4 and the electrodes 2 on the element chip 1 can be directly connected, for example.

According to this embodiment, since the semiconductor element chip 1 and the electronic element 4 can be superposed on each other in a self-alignment manner by means of the positioning guide 3, the assembling process can be made simple. Further, the whole portion of the circuit can be formed with an extremely small size while the output element is formed with a larger current capacity and higher withstand voltage as a power integrated circuit.

According to a second embodiment shown in FIGS. 2A and 2B, a plurality of guide holes are selectively formed in the positioning guide 3 and a plurality of electronic elements 41, 42, . . . are disposed in alignment with preset portions on the semiconductor element chip 1 by use of the guide holes.

With reference to FIGS. 3A to 3D, a method of manufacturing the composite integrated circuit device shown in FIG. 1 is explained.

Figure 3A:
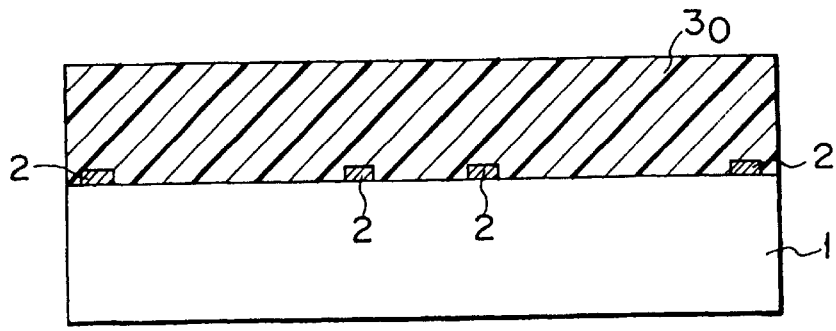
FIGS. 3A to 3D respectively show the cross sections of semiconductor structures in the respective manufacturing steps for the composite integrated circuit device shown in FIG. 1A.
Figure 3B:
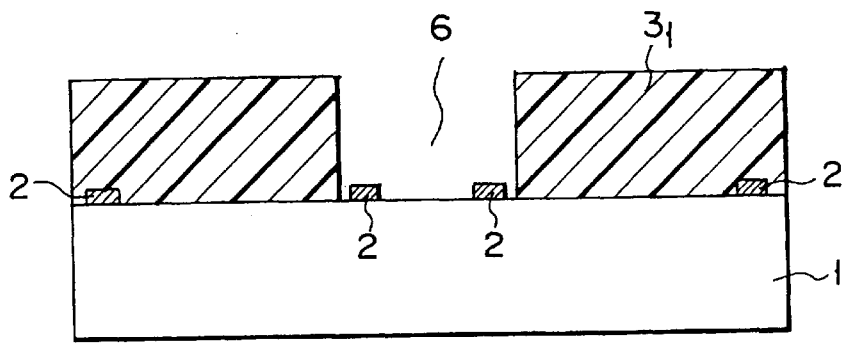
Figure 3C:
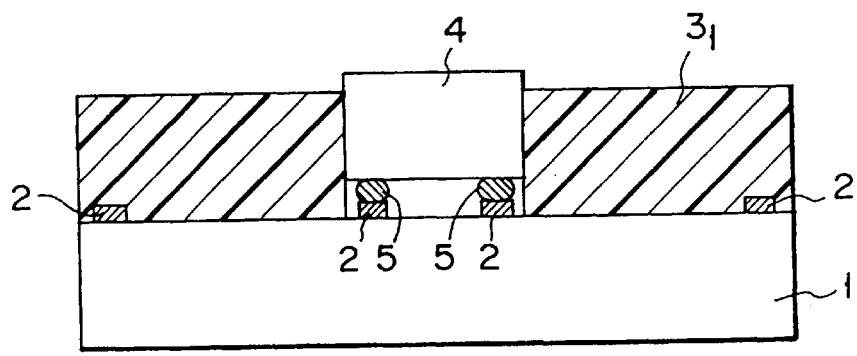
Figure 3D:
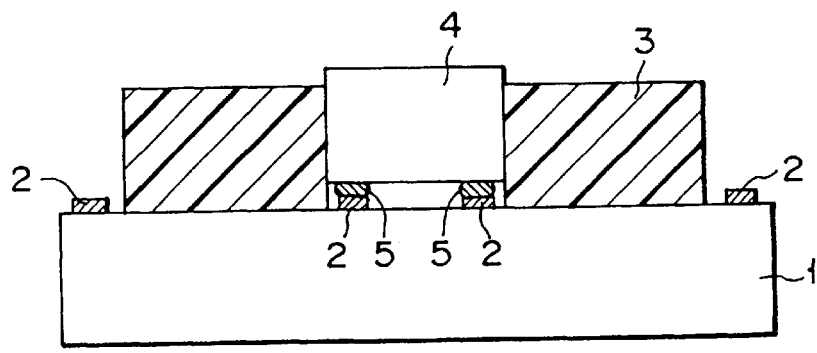

As shown in FIG. 3A, a resin member 30 of polyimide, for example, used as the positioning guide 3 is formed on the entire portion of that surface of the semiconductor element chip 1 on which the terminal electrodes 2 are formed. Next, as shown in FIG. 3B, the resin member 30 is selectively etched to form a guide opening 6. As shown in FIG. 3C, the electronic element 4 is put on the integrated circuit chip 1 via the guide opening 6 and pressed against the chip 1. Thus, the terminal electrodes 5 of the electronic element 4 are connected to the terminal electrodes 2 of the semiconductor element chip 1. That is, the electronic element 4 is bonded to the chip 1. Finally, unwanted portions of the resin member 30 are removed by etching to expose the terminal electrodes 2 necessary for the semiconductor element chip 1.

The above bonding process may be effected for a unit of semiconductor element chip 1 which can be obtained by separating a wafer or for a wafer which is not yet subjected to the separation process.

With the above process, the elements 1 and 2 can be set in alignment with each other with high precision and integrated together.

According to a third embodiment shown in FIGS. 4A and 4B, a second semiconductor element chip 11 is set in alignment with the first semiconductor element chip 1 by use of the positioning guide 3 and mounted there. The second semiconductor element chip 11 has one or more elements formed thereon. In this embodiment, the second element chip 11 is mounted over the first semiconductor element chip 1 while it is electrically isolated from the first semiconductor element chip 1 which lies in the lower position by means of an insulation film 13. Terminal electrodes 12 are arranged on the surface of the second element chip 11, and may be connected to the terminal electrodes 2 of the first element chip 1 or other external circuits by use of bonding wires (not shown).

Figure 5A:
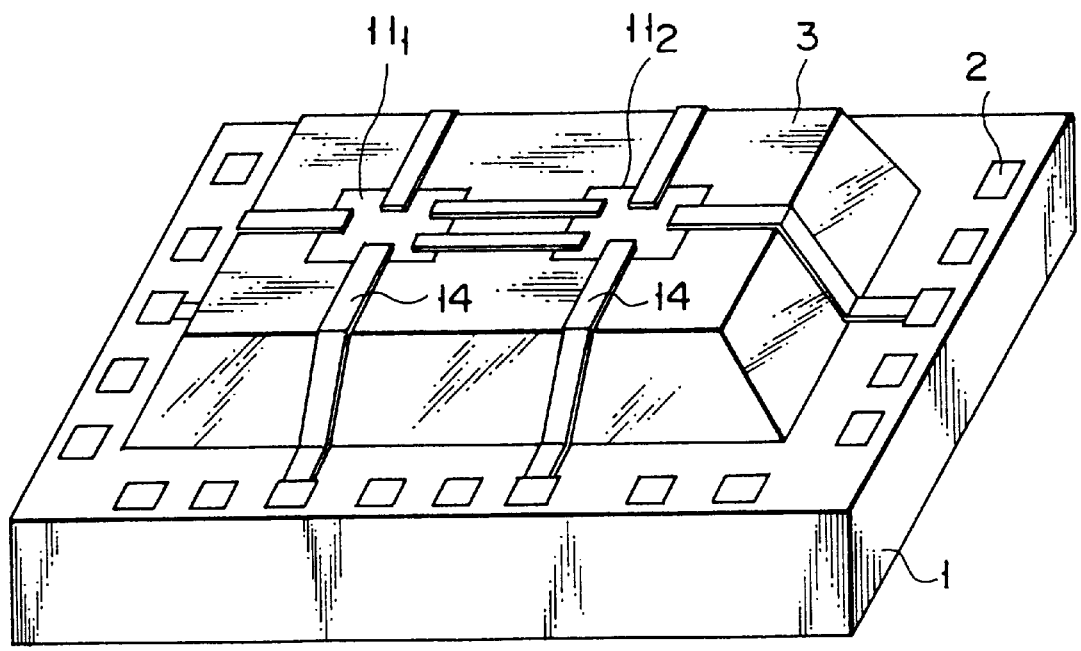
FIG. 5A is a perspective view of a composite integrated circuit device according to a fourth embodiment.
Figure 5B:
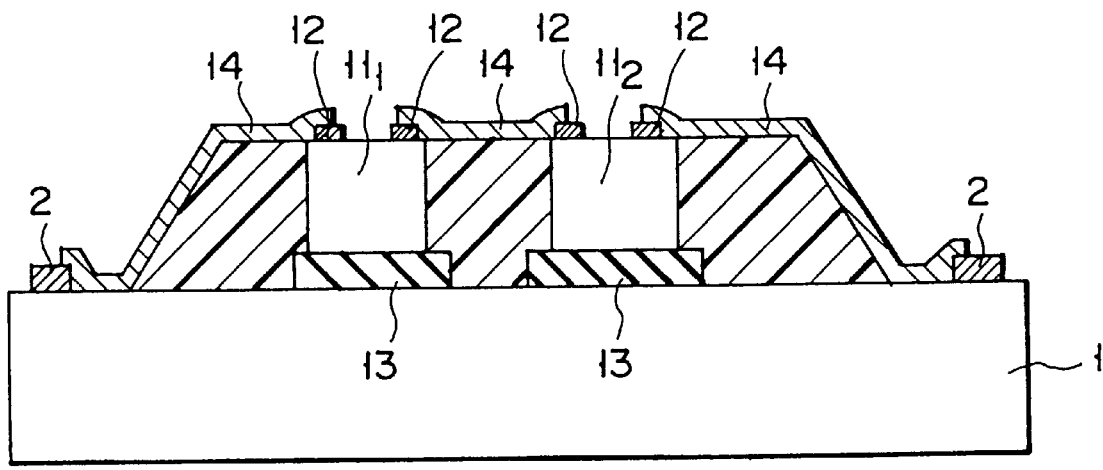
FIG. 5B is a cross sectional view of the composite integrated circuit device shown in FIG. 5A.

FIGS. 5A and 5B show an embodiment obtained by slightly modifying the embodiment of FIGS. 4A and 4B. In this embodiment, two second semiconductor element chips 11 and 112 are mounted on a first semiconductor element chip 1, but the basic construction thereof is the same as that of FIG. 4. In this embodiment, the terminal electrodes 2 of the first element chip 1 and the terminal electrodes 12 of the second element chip 11 are connected together via thin film wirings 14 formed by vapor deposition or sputtering. In this case, in order to prevent breakage of the wire 14 at the stepped portion, the side portion of the positioning guide 3 is formed in a tapered form.

Figure 6A:
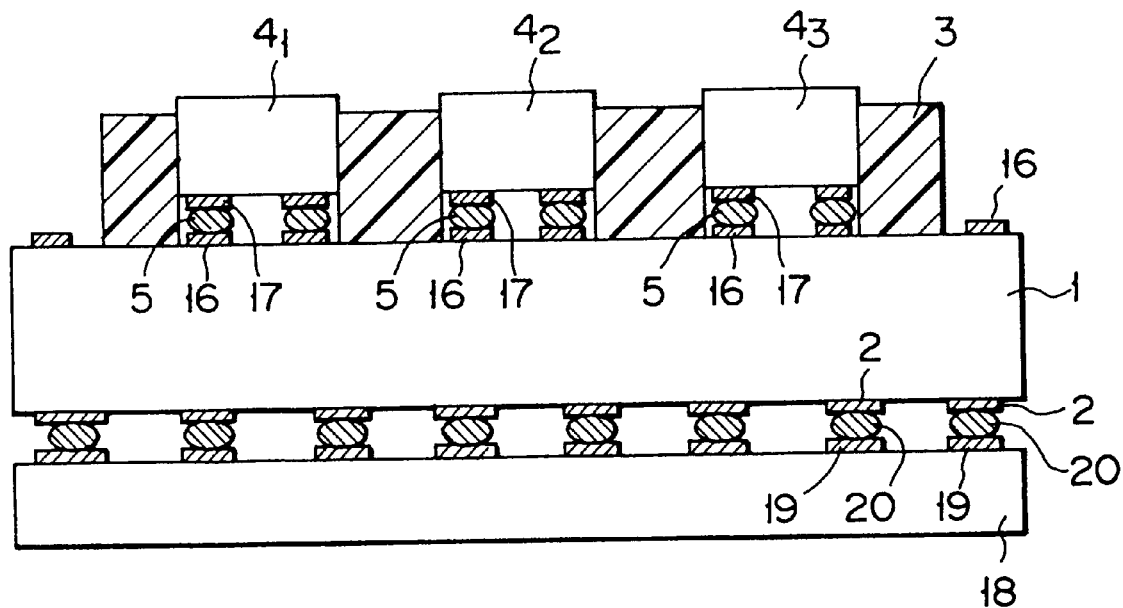
FIG. 6A is a cross sectional view of a composite integrated circuit device according to a fifth embodiment.
Figure 6B:
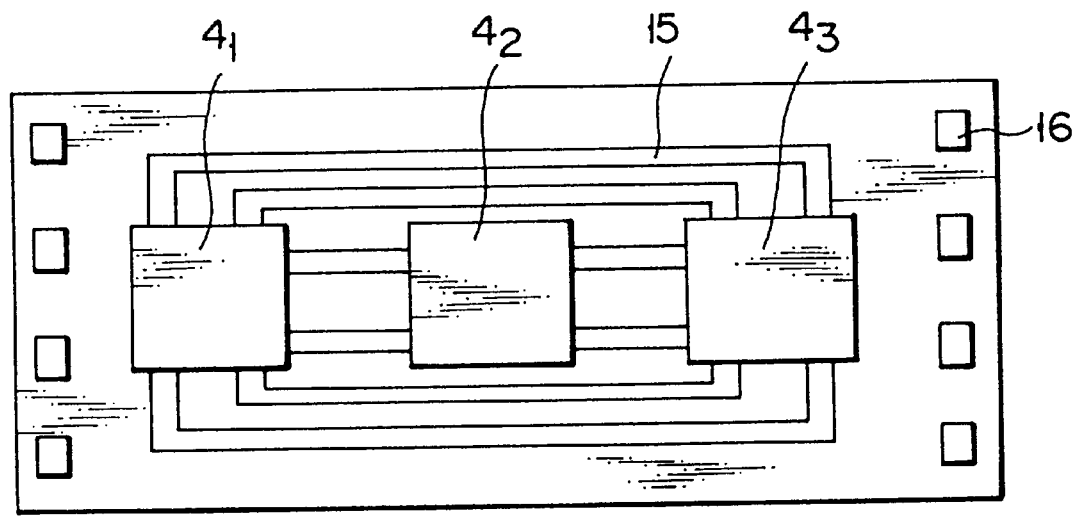
FIG. 6B is a plan view of the composite integrated circuit device shown in FIG. 6A.

According to a fifth embodiment shown in FIGS. 6A and 6B, the surface (front surface) of a first semiconductor element chip 1 on which circuit elements are formed and terminal electrodes 2 are disposed is shown as a bottom surface in the drawing. A plurality of electronic elements 4 ($4_1$, $4_2$, $4_3$) are mounted on the rear surface of the element chip 1 in a self-alignment manner by use of the positioning guide 3. At this time, the rear surface of the element chip 1 is used as a wiring surface for connecting the terminals of the electronic elements 4 mounted on the chip to one another. That is, wirings 15 are previously formed on the rear surface of the element chip 1 before the electronic elements 4 are formed on the chip. The electronic elements 4 are mounted on the chip 1 by use of the positioning guide 3 in the same manner as that of the embodiment shown in FIG. 1. Terminal electrodes 17 on the electronic elements 4 are connected to terminal electrodes 16 formed on the rear surface of the element chip 1 together with the wirings 15 via the connection metals 5. Thus, the integrated circuits on the element chip 1 are connected to the electronic elements. The terminal electrodes 16 which are arranged outside the positioning guide 3 are used to connect the terminals of the circuits of the electronic elements 4 to the exterior.

For connection between the semiconductor element chip 1 and the exterior, a bump structure is used. That is, the terminal electrodes 2 of the element chip 1 are connected to terminal electrodes 19 formed on the surface of an electrode plate 18 via a connection metal 20.

Figure 7A:
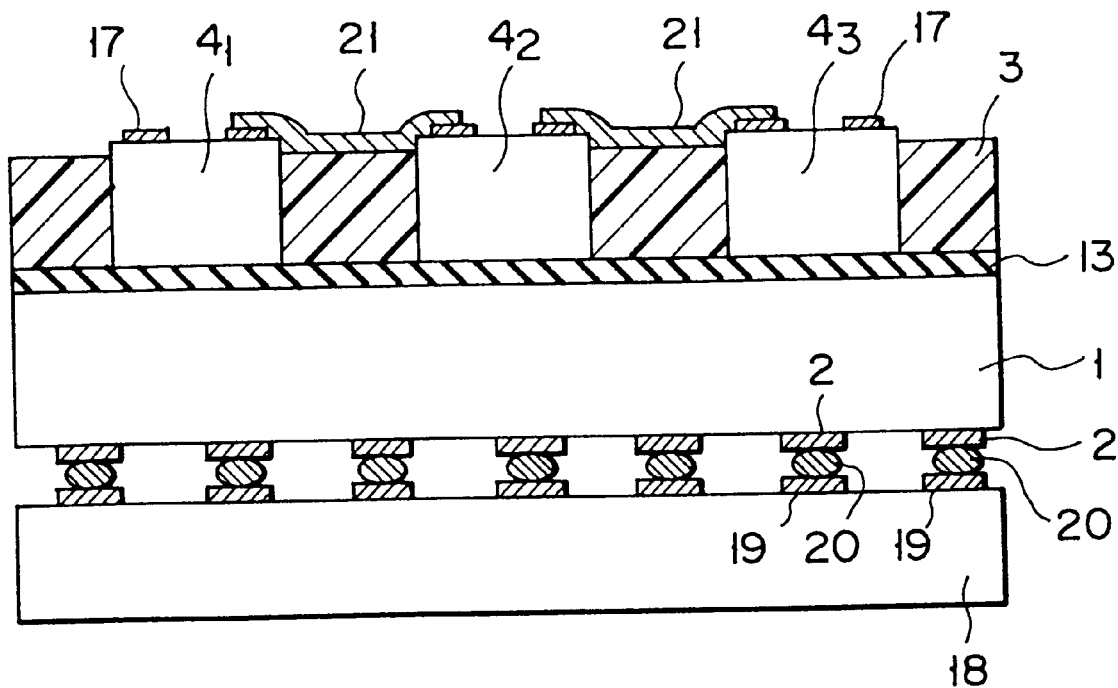
FIG. 7A is a cross sectional view of a composite integrated circuit device according to a sixth embodiment.
Figure 7B:
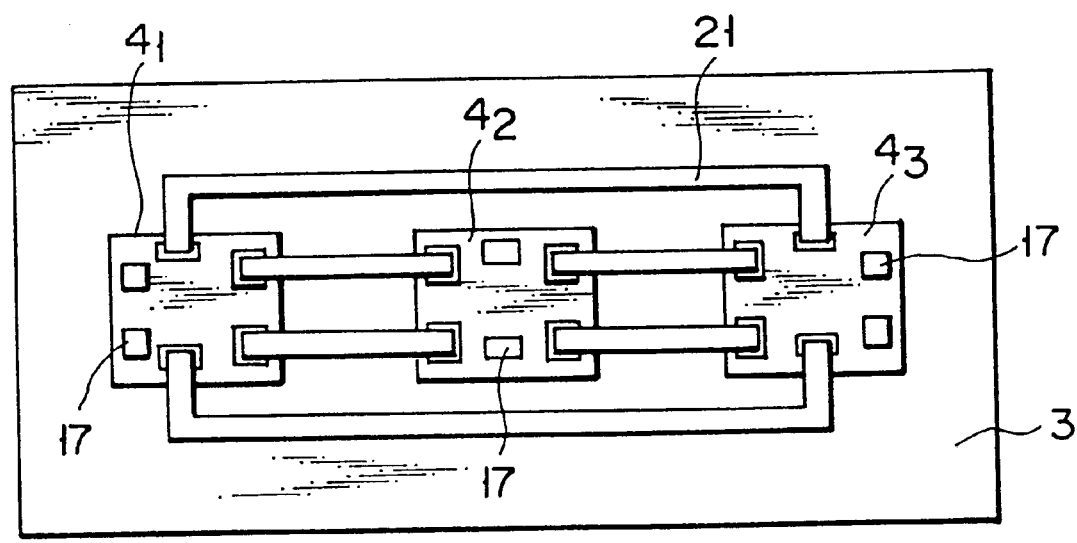
FIG. 7B is a plan view of the composite integrated circuit device shown in FIG. 7A.

FIGS. 7A and 7B show an embodiment which can be obtained by modifying the embodiment of FIG. 6A. This embodiment is the same as the embodiment of FIG. 6A in that electronic elements 4 are formed on the rear surface of the semiconductor element chip 1 and terminal electrodes on the surface of the semiconductor element chip 1 are connected to the exterior by use of the bump structure. In this embodiment, the front and rear surfaces of the electronic elements 4 of FIG. 6A are reversed. That is, the electronic elements 41 42 and 43 are mounted on the semiconductor element chip 1 with the rear surfaces of the electronic elements 41 42 and 43 down while they are electrically isolated from the semiconductor element chip 1 by means of an insulation film 13. Connection between the terminal electrodes 17 on the surfaces of the electronic elements 41 42 and 43 is attained by disposing wirings 21 on the positioning guide 3.

In each of the embodiments shown in FIGS. 6A and 7A, the electrode plate 18 may be an electrode plate on which a thin film circuit utilizing a silicon film is formed in addition to the electrodes. Further, if the electrode plate 18 is formed of a transparent plate such as quartz, it becomes possible to transfer signals with respect to the semiconductor element chip 1 by inputting an optical signal via the electrode plate 18.

Figure 8A:
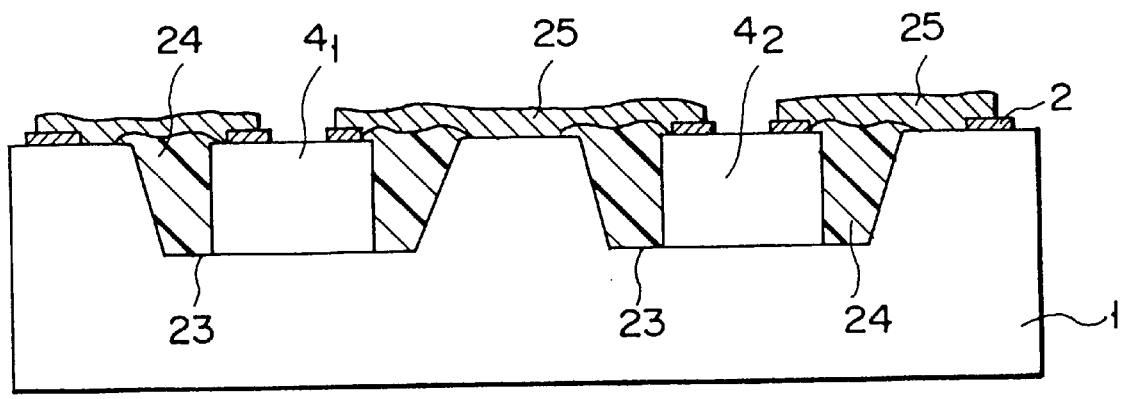
FIG. 8A is a cross sectional view of a composite integrated circuit device according to a seventh embodiment.
Figure 8B:
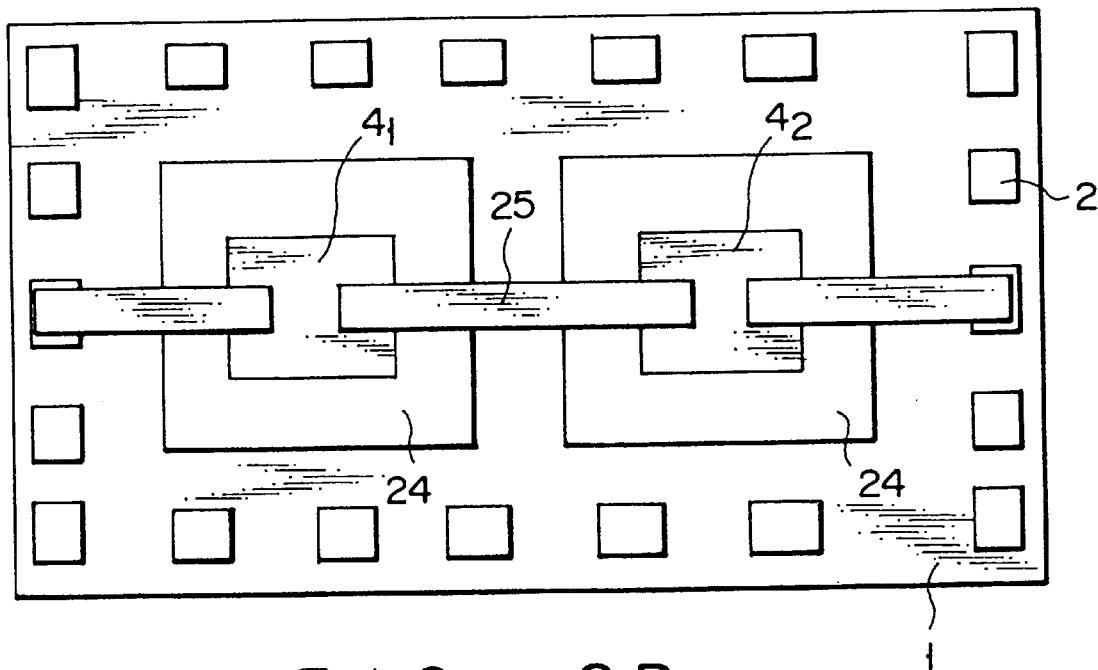
FIG. 8B is a plan view of the composite integrated circuit device shown in FIG. 8A.

According to a seventh embodiment shown in FIGS. 8A and 8B, grooves 23 are formed in part of a semiconductor element chip 1 and electronic elements 4 are disposed within the grooves 23. In this case, the electronic elements 4 and the semiconductor element chip 1 are arranged so that the upper surfaces thereof may substantially coincide with each other. Gaps between the electronic elements 4 and the grooves 23 of the semiconductor element chip 1 are filled with resin 24, or other insulation material or polycrystalline silicon so as to make the surface flat. Wirings 25 for connection between the electronic elements 4 and between the electronic elements 4 and the semiconductor element chip 1 are disposed on the thus flattened surface.

An embodiment shown in FIGS. 9A and 9B is constructed by a combination of the embodiments shown in FIGS. 7A and 8A. That is, the surface on which the terminal electrodes 2 of the semiconductor element chip 1 are formed is set to face downward and wirings are disposed by use of the electrode plate 18 in the same manner as in the embodiment shown in FIG. 7A. Grooves 23 are formed in the rear surface area of the semiconductor element chip 1, electronic elements 4 are buried in the grooves in the same manner as in the embodiment shown in FIG. 8A, the surface is made flat by use of resin 24 and wirings 24 for connection between the electronic elements 4 are disposed on the surface.

Figure 10A:
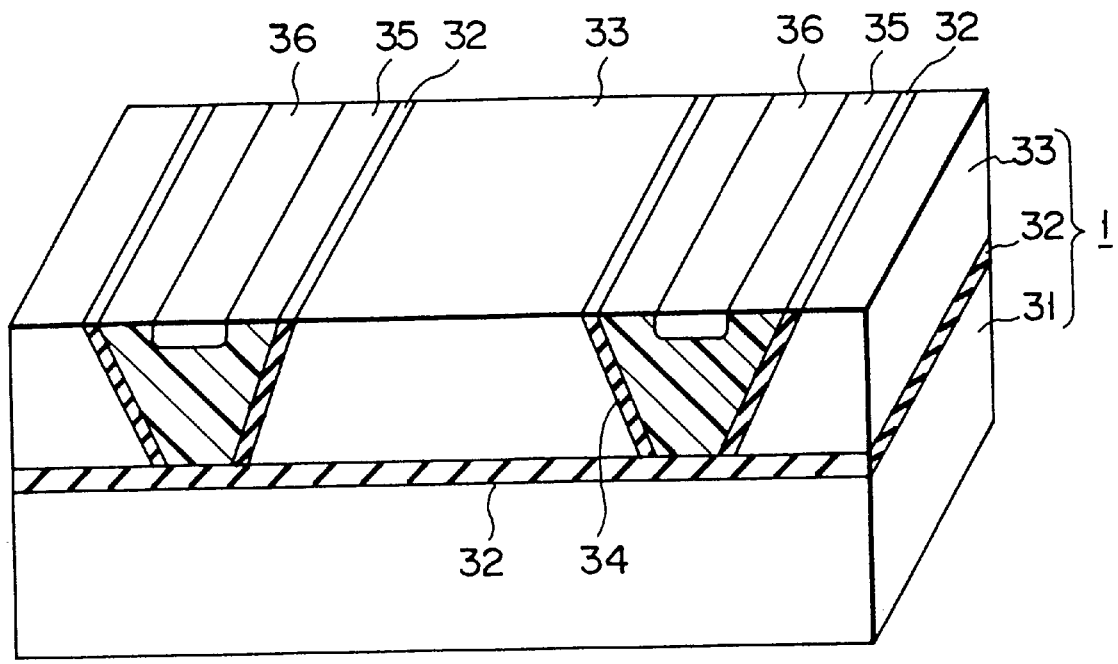
FIG. 10A is a perspective view of a composite integrated circuit device according to a ninth embodiment.
Figure 10B:
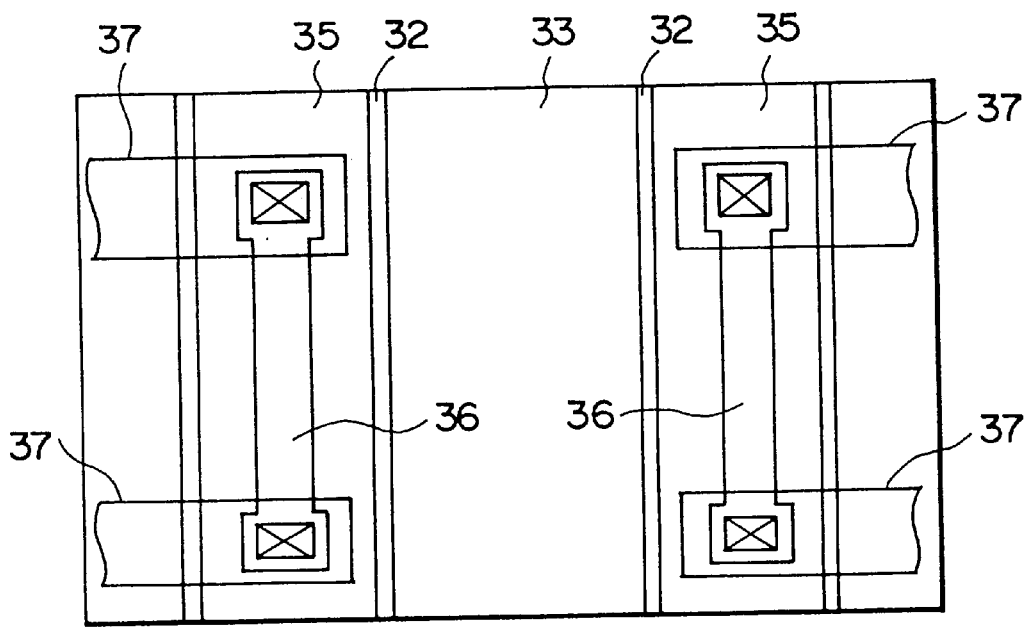
FIG. 10B is a plan view of the composite integrated circuit device shown in FIG. 10A.

According to a ninth embodiment shown in FIGS. 10A and 10B, a semiconductor element chip 1 has a dielectric isolation structure. That is, a semiconductor layer 33 is formed over a semiconductor substrate 31 and isolated therefrom with an insulation film 32 disposed therebetween. The semiconductor layer 33 is also divided into a plurality of island regions in a lateral direction by means of isolation grooves 34 and desired elements are formed in the respective island regions.

The dielectric isolation structure can be attained by use of the direct bonding technology for the silicon substrate, for example. That is, a first silicon substrate corresponding to the substrate 31 and a second silicon substrate corresponding to the semiconductor layer 33 are prepared and the silicon substrates are subjected to the mirror-finishing process. After the insulation film 32 is formed on the surface of one of the silicon substrates 31 and 33, the substrates are joined with the insulation film 32 disposed therebetween to form an integrated wafer. The element isolation grooves 34 are formed in the thus integrated wafer, and the insulation film 32 is also formed on the surfaces of the grooves 34 to form island regions which are isolated in the lateral direction on the substrate 33. For example, polysilicon films 35 are buried in the respective isolation grooves 34.

In the above ninth embodiment, diffusion layer resistors 36 are formed by diffusing impurity into the polysilicon films 35 buried in the element isolation regions. As shown in FIG. 10B, the diffusion layer resistors 36 are led out via wirings 37 and connected to elements formed in the semiconductor layer 33.

Thus, if the diffusion layer resistor is formed in the polysilicon film of the element isolation region, the resistor having a large current capacity or large resistance makes it possible to attain electrical isolation with respect to the element region of semiconductor element chip 1 and permits the chip area to be effectively used.

Figure 11:
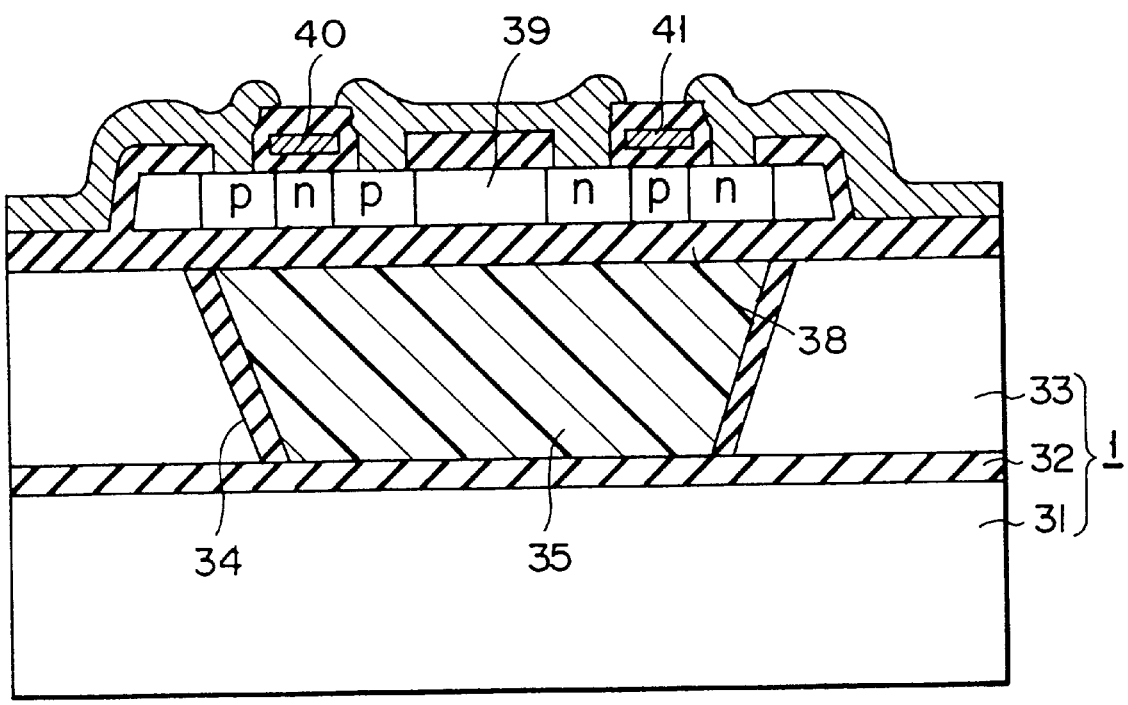
FIG. 11 is a cross sectional view of a composite integrated circuit device according to a tenth embodiment.

According to a composite integrated circuit device of a tenth embodiment shown in FIG. 11, a semiconductor element chip 1 has the same dielectric isolation structure as in the embodiment shown in FIG. 10. Also, in this embodiment, a CMOS circuit is formed in an element isolation region of the element chip 1 in which a polysilicon film 35 is buried. That is, a polysilicon film 39 is formed over the element isolation region with an insulation film 38 disposed therebetween and the polysilicon film 39 is used to form a p-channel MOS transistor 40 and an n-channel MOS transistor 41.

Figure 12D:
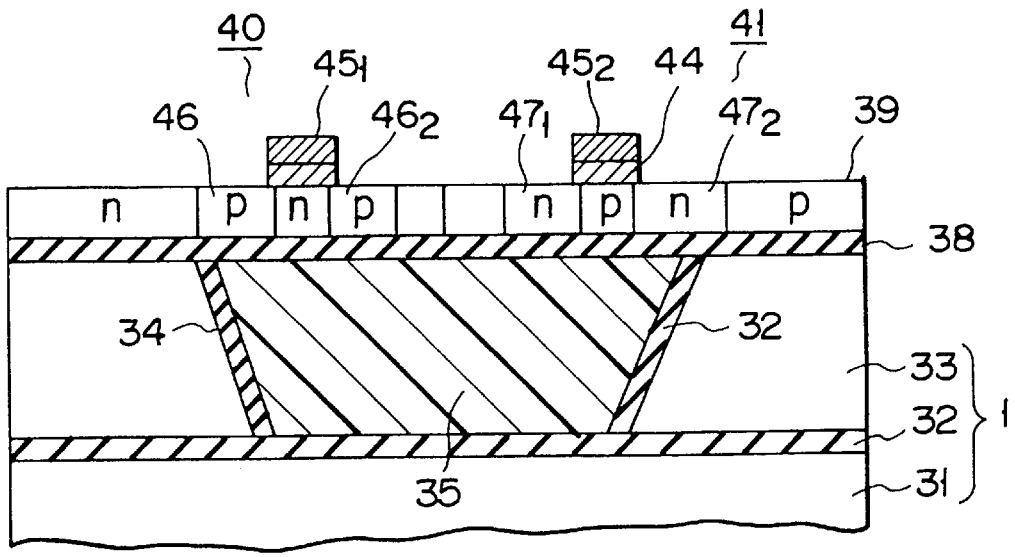
Figure 12E:
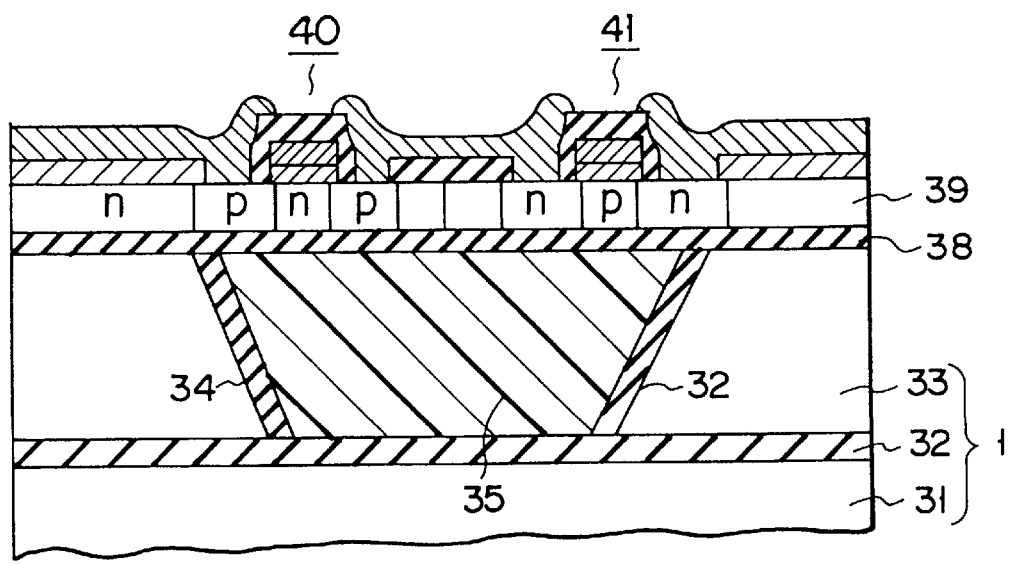

A method of manufacturing the composite integrated circuit device of FIG. 11 is explained with reference to FIGS. 12A to 12E. After the semiconductor element chip 1 having the dielectric isolation structure is formed as described above, the polysilicon film 39 is deposited over the chip with the insulation film 38 disposed therebetween (FIG. 12A). A necessary impurity is doped into the thus deposited polysilicon film 39 by use of the ion-implantation technique, for example, so as to form an n-type region 42 and a p-type region 43 in the polysilicon film 39 (FIG. 12B). Next, a gate insulation film 44 is formed on the polysilicon film 39 (FIG. 12C) and then a polysilicon film is deposited on the gate insulation film 44 and patterned to form gate electrodes $45_1$ and $45_2$ on the silicon film 39. Impurities are sequentially ion-implanted into the respective element regions with the gate electrodes used as a mask so as to form p-type layers $46_1$ and $46_2$ and n-type layers $47_1$ and $47_2$ which serve as sources and drains on the silicon film 39 (FIG. 12D). The thus formed p-channel MOS transistor 40 and n-channel MOS transistor 41 are covered with an insulation film, contact holes are formed in the insulation film and wirings are formed so as to form a CMOS circuit on the semiconductor chip 1 (FIG. 12E).

In FIGS. 12A to 12E, the polysilicon film 39 is shown to remain in a continuous form, but a structure shown in FIG. 11 can be obtained by selectively etching the same in a proper step to leave only the necessary region in an island configuration.

In the above tenth embodiment, the isolation regions on the semiconductor element chip 1 are effectively used and elements are formed on the respective isolation regions so as to form a composite integrated circuit.

FIGS. 13A and 13B are cross sectional and plan views showing a composite integrated circuit device according to an eleventh embodiment. In the composite integrated circuit of this embodiment, signal transfer can be effected without using electrical connection by incorporating a photocoupler. A semiconductor element chip 1 has one or more elements formed thereon in the same manner as in the other embodiments. In this case, an n-type epitaxial layer 52 is formed on a p-type semiconductor substrate 51, the n-type layer 52 is isolated into element regions by a p-type layer 53 and desired elements are formed in the respective element regions.

In part of the above semiconductor element chip 1, a photodiode PD is formed as a light receiving element. That is, as shown in the drawing, a p-type diffused layer 55 is formed in the surface area of the n-type layer 52 which is isolated by the p-type layer 53 to form the photodiode PD. An n-type buried layer 54 is formed between those portions of the substrate 51 and the n-type layer 52 which lie below the photodiode PD, and as shown in FIG. 13B, the buried layer 54 is led out to the surface by means of an n-type diffused layer 56.

Further, a thin film circuit using a polysilicon film 58 is formed over the semiconductor element chip 1 with an insulation film 57 disposed therebetween. That is, a light emitting diode LED is formed in opposition to the photodiode PD as one of the thin film circuits. The light emitting diode LED is constructed by forming a pn junction 59 in a lateral direction by use of the polysilicon film 58 which is patterned in a preset configuration and placed on the photodiode PD. Two terminals of the light emitting diode LED are connected to the terminals of other elements adjacent to the photodiode PD of the element chip 1 as shown in the drawing, for example. The terminal of the photodiode PD is led out to the surface of the element chip 1.

When a pn junction is formed in the polysilicon film 58 and a forward current of more than a certain amount is caused to flow across the pn junction, an infrared ray is emitted from the pn junction. In this embodiment, the photodiode LED based on this principle is formed on the semiconductor element chip 1 and the photodiode PD is formed in opposition to the light emitting diode LED in the semiconductor element chip 1. That is, a photocoupler in which an infrared ray emitted from the light emitting diode LED is detected by the photodiode PD is formed on the substrate 51.

Thus, according to this embodiment, when a current flows in the polysilicon film 58 constituting the light emitting diode LED, the current flow can be detected by use of the photodiode PD in the element chip 1 without using electrical connection. That is, a portion of the light emitting diode LED can be regarded as functioning as a simple current path in the integrated circuit, and in this embodiment, the photocoupler is integrally formed in the substrate 51 as a current detection means of the current path.

In FIGS. 13A and 13B, the photodiode PD is formed on the semiconductor element chip 1 and the light emitting diode LED is formed in the thin film circuit which is formed on the photodiode PD, but the positional relation of the light emitting element and the light receiving element may be inverted.

When the elements are arranged in a 3-dimensional fashion as in this invention, cooling of the elements becomes a problem. In order to effectively radiate heat, it is preferable to cool the elements from the top portion of the laminated elements. An embodiment in which such a cooling system is used is explained below.

Figure 14:
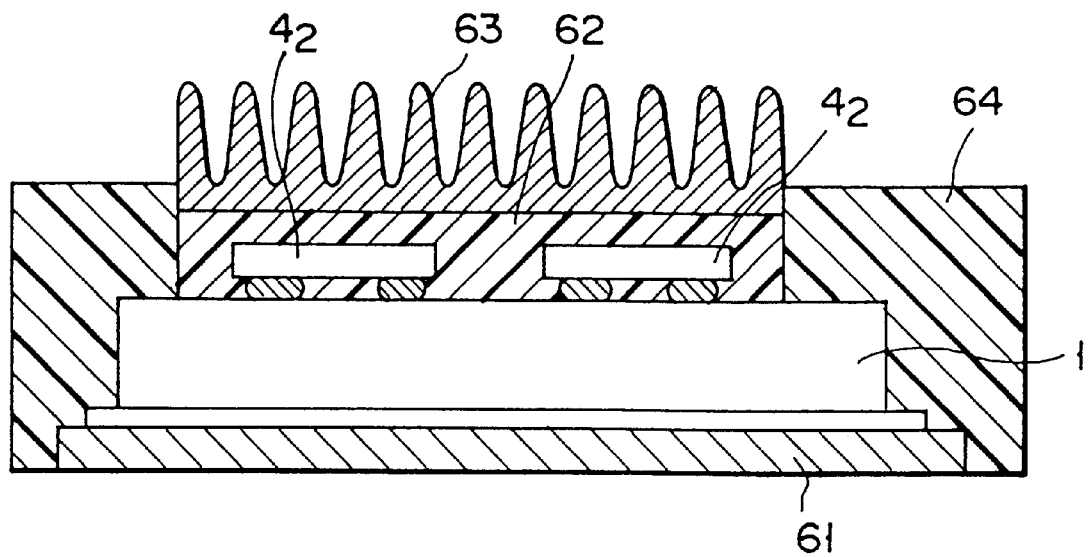
FIG. 14 is a cross sectional view of a composite integrated circuit device according to a twelfth embodiment and having a cooling system.

A composite integrated circuit device according to a twelfth embodiment shown in FIG. 14 has a packaged structure. That is, electronic elements 4 are integrated by one of the methods described before. In order to attain effective heat radiation from the lower surface thereof, the semiconductor element chip 1 is mounted on a metal plate 61. The chip surface on which the electronic elements 4 are mounted is covered with resin 62 having a high heat conductivity and a cooling fin 63 is mounted on the surface. Further, the whole portion is molded with resin 64.

According to this embodiment, cooling operations can be effected from the top and bottom portions so as to effectively radiate heat from the composite integrated circuit.

In the above embodiments, the electronic elements integrated on the semiconductor element chip include various types of passive elements in addition to the semiconductor elements, but simple passive elements can be formed on the resin which is formed as the positioning guide or the like in the embodiment of FIG. 1, for example.

Figure 15:
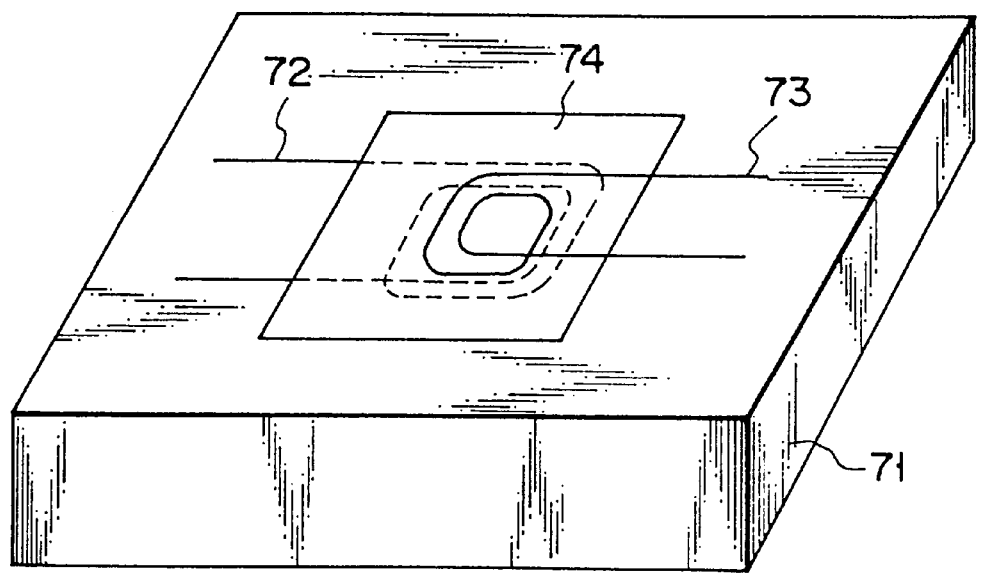
FIG. 15 is a cross sectional view of a composite integrated circuit device according to a thirteenth embodiment.

For example, as shown in a thirteenth embodiment of FIG. 15, a transformer which is one of the passive elements can be formed with a small size on the chip. That is, a transformer having primary and secondary windings which are formed of first and second windings 72 and 73 laminated with a film 74 of high magnetic permeability disposed therebetween can be formed in an area of a 3-dimensional integrated element 71 which is covered with resin.

Figure 16:
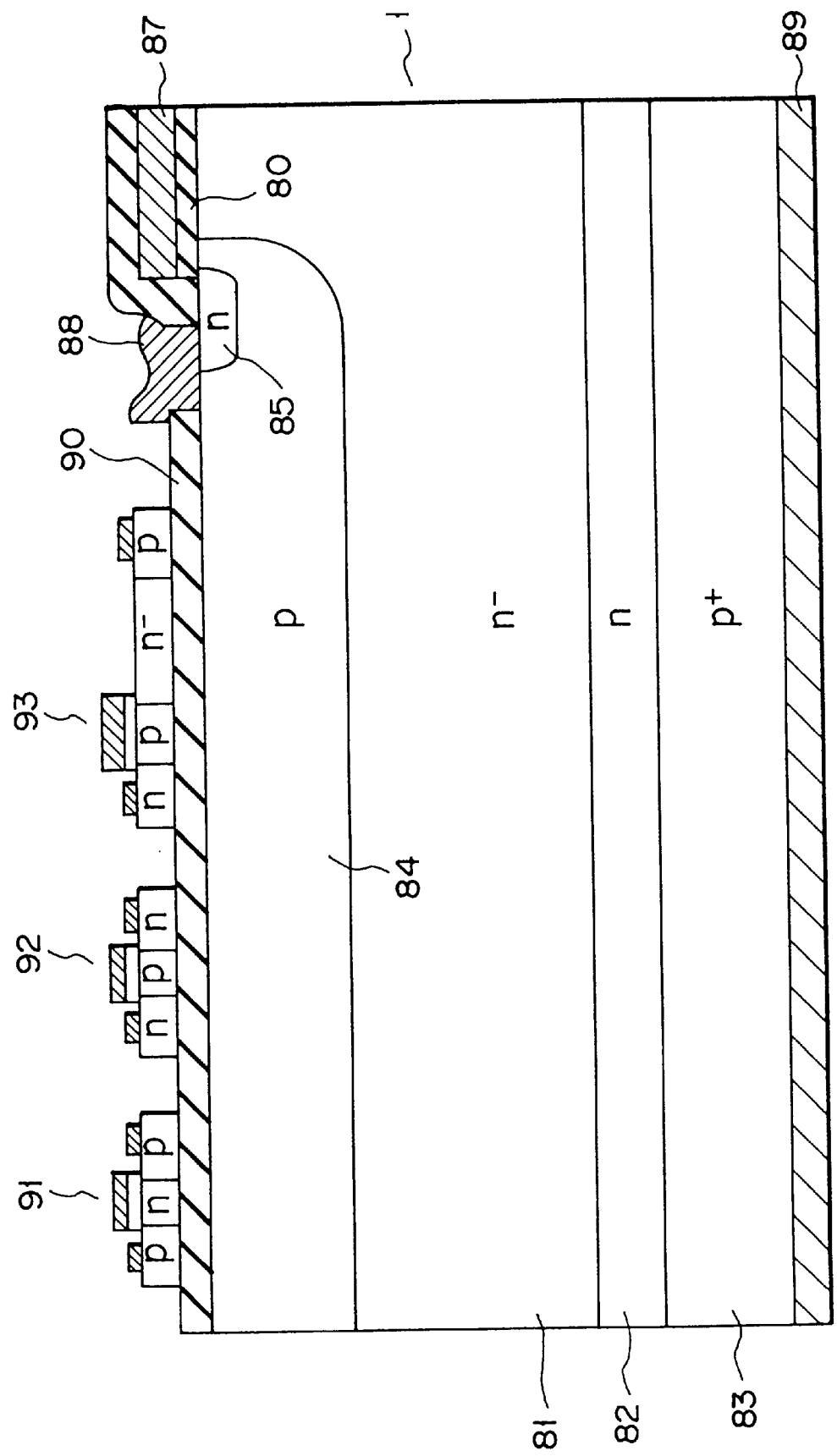
FIG. 16 is a cross sectional view of a composite integrated circuit device according to a fourteenth embodiment.

According to a fourteenth embodiment shown in FIG. 16, a semiconductor element chip used as a basic unit is not constituted by an integrated circuit but by a discrete semiconductor element. In this example, the semiconductor element 1 constitutes a conductive modulation type MOSFET which is a high-power element in which a current is permitted to flow in a vertical direction. That is, the conductive modulation type MOSFET is formed of a high-resistance n-type base layer 81, a p-type drain layer 83, and an n-type buffer layer 82 disposed between one surface of the base layer 81 and the p-type drain layer 83. A p-type base layer 84 is formed on the other surface of the n-type base layer 81 and an n-type source layer 85 is formed in the p-type base layer 84. A gate electrode 87 is formed in an area disposed between the n-type source layer 85 formed in the p-type base layer 84 and the n-type base layer 81 with a gate insulation film 86 disposed therebetween. A source electrode 88 which is formed in contact with the p-type base layer 84 is formed in contact with the n-type source layer 85, and a drain electrode 89 is formed on the p-type drain layer 83.

For example, a gate circuit or protection circuit for controlling the conductive modulation type MOSFET by means of a thin film circuit using a polysilicon film is formed on an insulation film 90 which is formed on the p-type base layer of the conductive modulation type MOSFET. In the drawing, a p-channel thin film transistor 91, an n-channel thin film transistor 92 and a MOS gate thyristor 93 are shown as an element using the polysilicon film.

Figure 17:
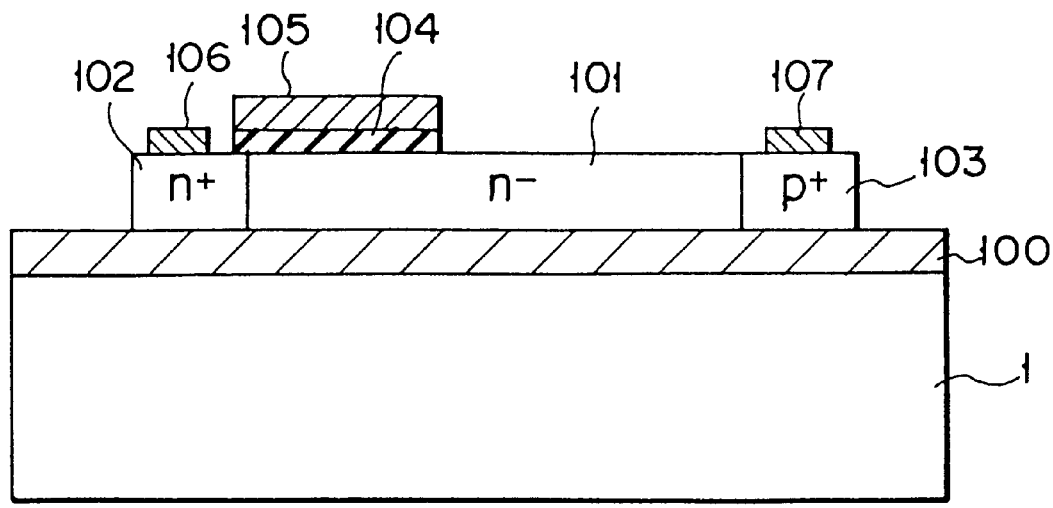
FIG. 17 is a cross sectional view of a composite integrated circuit device according to a fifteenth embodiment.

According to a fifteenth embodiment shown in FIG. 17, a thin film switching element of special structure having a MOS gate is formed on a semiconductor element chip 1. That is, in this embodiment, an n-type polysilicon film 101 of high resistance is deposited over the semiconductor element chip 1 as a thin semiconductor film with an insulation film 100 disposed therebetween and patterned, and an n-type cathode layer 102 is formed on one end thereof and a p-type anode layer 103 is formed on the other end thereof. A gate electrode 105 is formed over that portion of the n-type polysilicon film 101 which lies adjacent to the n-type cathode layer 102 with a gate insulation film 104 disposed therebetween and cathode and anode electrodes 106 and 107 are respectively formed on the cathode and anode layers 102 and 103 to constitute a MOS gate diode switch.

Figure 18A:
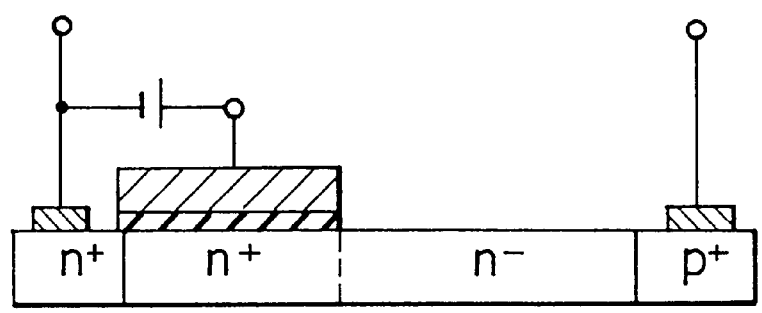
FIGS. 18A and 18B are cross sectional views of a semiconductor device having the switching element shown in FIG. 17 and respectively set in the ON and OFF states.
Figure 18B:
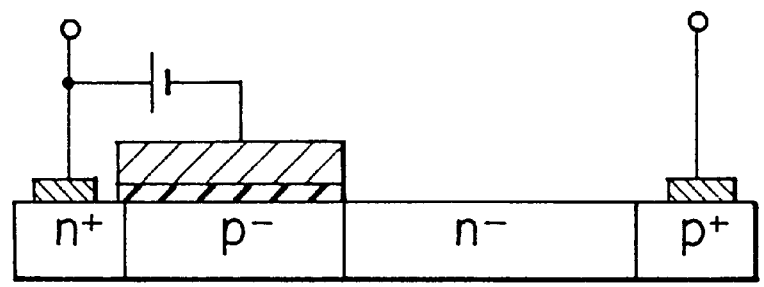

FIGS. 18A and 18B show an operating condition of the MOS gate diode switch. As shown in FIG. 18A, when a bias voltage which is positive with respect to the cathode is applied to the gate electrode 104, an n-type layer of high impurity concentration is formed under the gate electrode 104, thereby reducing the effective distance between the anode and cathode. That is, if a forward current is caused to flow in the diode in this condition, an extremely small ON-voltage can be derived. A distance between the anode and cathode is set to an original distance as shown in FIG. 17 when a 0 bias voltage is applied to the gate and a sufficiently high resistance can be obtained in the OFF state, for example. On the other hand, when a bias voltage which is negative with respect to the cathode is applied to the gate electrode 104, a portion under the gate electrode 104 is inverted into a p-type layer as shown in FIG. 18B. If the polysilicon film 101 is made thin to some extent, a portion under the gate electrode 104 is completely inverted into a p-type layer in the thickness direction thereof. Therefore, even in a state in which a forward bias voltage is applied between the anode and cathode to cause a current to flow, the current can be cut off by applying a bias voltage to the gate as shown in the drawing.

FIGS. 19A to 19C show a sixteenth embodiment obtained by modifying the embodiment of FIG. 17. FIG. 19C is a plan view of a composite integrated circuit device, and FIGS. 19A and 19B show cross sections of the circuit device taken along the lines A—A' and B—B' of FIG. 19C. In this embodiment, a p-type base layer 108 is formed on one end portion of an insulation film 100 and a plurality of n-type cathode layers 102 are disposed near the p-type base layer 108 with a preset distance from each other. With this construction, holes in the p-type base layer 108 are caused to flow into an n⁻-type silicon layer 101 via a portion between the n-type cathode layers 102. Therefore, the ON-operation speed of the switching element becomes high.

The MOS gate diode of this embodiment may effect the same switching operation as that of FIG. 17.

According to a seventeenth embodiment shown in FIGS. 20A and 20B, an IGBT having a thin active layer is formed on a semiconductor element chip 1. That is, an active layer 101 of high resistance formed of n-type silicon with an extremely small thickness of approx. 1 μm is formed over the semiconductor element chip 1 with a silicon oxide film 100 having a thickness of approx. 1 to 5 μm disposed therebetween and a p-type base layer 201 and an n-type base layer 202 are formed with a preset distance in the active layer 101. The p-type base layer 201 and the n-type base layer 202 are formed in the active layer 101 with a depth to reach the silicon oxide film 100 formed on the bottom of the active layer. An n-type source layer 203 is formed in the p-type base layer 201 and a p-type drain layer 204 is formed in the n-type base layer 202.

A gate electrode 206 is formed over an area of the p-type base layer 201 which lies between the n-type source layer 203 and the active layer 101 with a gate insulation film 205 disposed therebetween. A source electrode 207 is formed in contact with both of the p-type base layer 201 and the n-type source layer 203, and a drain electrode 208 is formed on the p-type drain layer 204.

In this embodiment, since the p-type base layer 201 and the n-type base layer 202 are formed in the active layer 101 with a depth to reach the oxide layer 100, an application voltage in a vertical direction may be shared by the oxide film 100 when a reverse bias voltage is applied. Therefore, even when the thin active layer 101 is used, an IGBT having a high withstand voltage characteristic can be obtained.

Figure 21A:
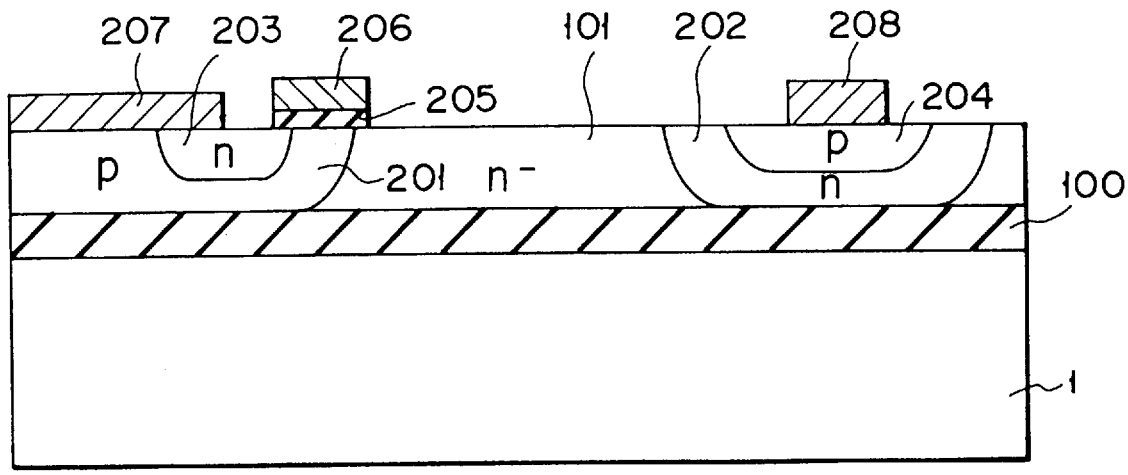
FIG. 21A is a cross sectional view of a composite integrated circuit device according to an eighteenth embodiment.
Figure 21B:
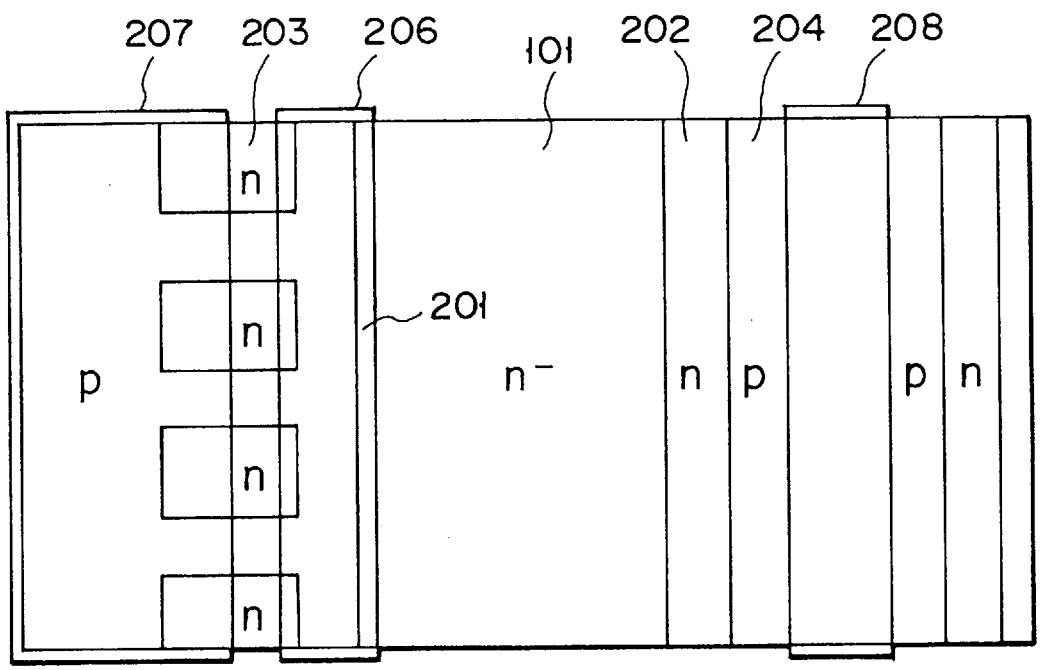
FIG. 21B is a plan view of the composite integrated circuit device shown in FIG. 21A.

FIGS. 21A and 21B show an eighteenth embodiment obtained by modifying the embodiment of FIGS. 20A and 20B. In the embodiment of FIGS. 20A and 20B, since the active layer 101 is a thin film, the width of the p-type base layer under the n-type source layer 203 is reduced when the p-type base layer 201 and the n-type source layer 203 are formed by use of double-diffusion technique with the gate electrode 206 used as a mask. As a result, the element tends to be subjected to a latch-up phenomenon. In this embodiment, an n-type source layer 203 is formed of a plurality of divided source regions and therefore the resistance of the p-type base layer 201 in the lateral direction can be prevented from being excessively large. That is, according to this embodiment, an active layer 101 of high resistance formed of n-type silicon with an extremely small thickness of approx. 1 μm is formed over the semiconductor element chip 1 with a silicon oxide film 100 having a thickness of approx. 1 to 5 μm disposed therebetween and a p-type base layer 201 and an n-type base layer 202 are formed with a preset distance in the active layer 101. The p-type base layer 201 and the n-type base layer 202 are formed in the active layer 101 with a depth to reach the silicon oxide film 100 formed on the bottom of the active layer. A plurality of n-type source regions 203 are separately formed in the p-type base layer 201 and a p-type drain layer 204 is formed in the n-type base layer 202.

A gate electrode 206 is formed over an area of the p-type base layer 201 which lies between the n-type source layer 203 and the active layer 101 with a gate insulation film 205 disposed therebetween. A source electrode 207 is formed in contact with both of the p-type base layer 201 and the n-type source layer 203, and a drain electrode 208 is formed on the p-type drain layer 204.

According to this embodiment, since the n-type base layer 203 is formed of a plurality of divided source regions, an IGBT which is difficult to be subjected to a latch-up phenomenon can be obtained.

Figure 22A:
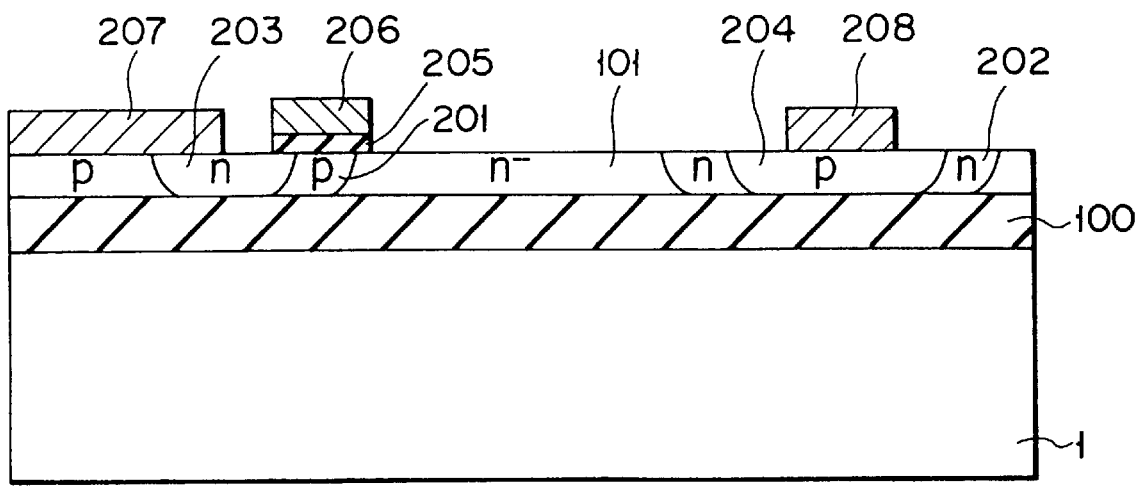
FIG. 22A is a cross sectional view of a composite integrated circuit device according to a nineteenth embodiment.
Figure 22B:
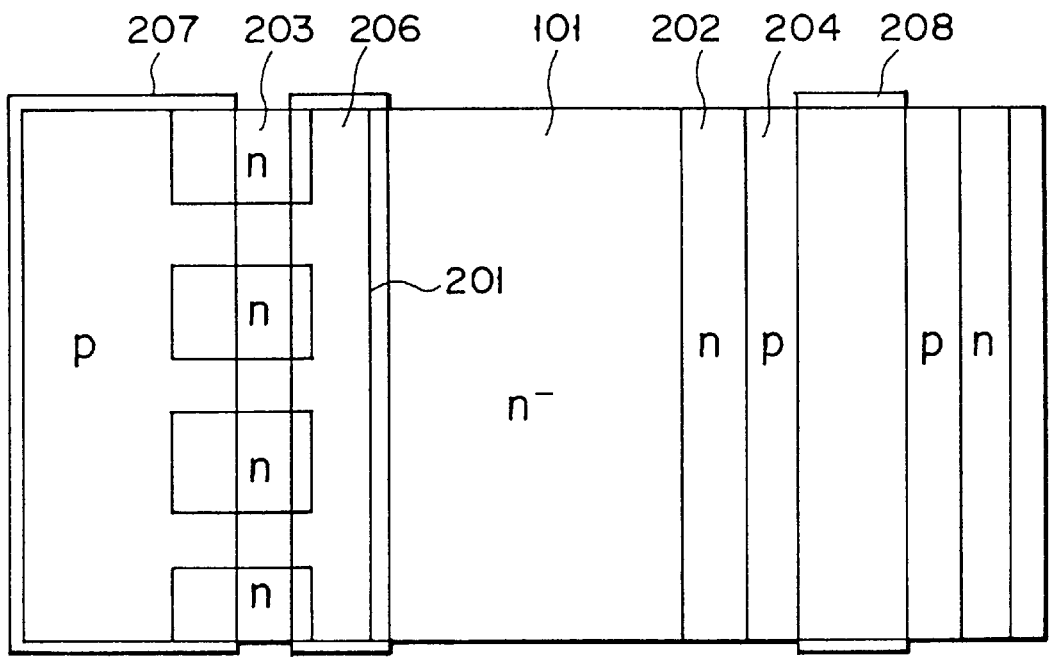
FIG. 22B is a plan view of the composite integrated circuit device shown in FIG. 22A.

FIGS. 22A and 22B show a nineteenth embodiment obtained by modifying the embodiment of FIGS. 21A and 21B. In this embodiment, the thickness of an active layer 101 is made smaller than that of the active layer in the eighteenth embodiment and an n-type source layer 203 and a p-type drain layer 204 are respectively formed in a p-type base layer 201 and an n-type base layer 202 to reach the bottom portions of the p-type base layer 201 and the n-type base layer 202 or an oxide film 100.

If the n-type source layer 203 is formed of a plurality of divided regions in the p-type base layer 201 as shown in the drawing, a portion of the p-type base layer 201 which lies below the gate electrode 206 may be short-circuited to the source electrode 207 so that the circuit device can be correctly operated.

FIGS. 23A and 23B show a twentieth embodiment obtained by modifying the embodiment of FIGS. 22A and 22B. In this embodiment, a plurality of n-type layers 211 are separately disposed in a p-type drain layer 204. Each of the n-type layers 211 is formed in the p-type drain layer 204 to reach the bottom of the p-type base layer 204 or an insulation film 100. According to this embodiment, injection of holes from the p-type drain layer 204 is suppressed to enhance the operation speed of the circuit element.

FIGS. 24A and 24B show a twenty-first embodiment constituting a bi-directional switching element by including a second gate electrode 206b in a construction similar to that of FIGS. 22A and 22B. That is, p-type base layers 201a and 201b are formed in a high-resistance active layer 101 with a depth to reach the bottom of the active layer or an oxide film 100, and a plurality of divided n-type emitter layers 203a and 203b are formed in the p-type base layers 201a and 201b. Gate electrodes 206a and 206b are respectively formed over the end portions of the p-type base layers 201a and 201b with gate insulation films 205a and 205b disposed therebetween. A first main electrode 207a is formed in contact with the p-type base layer 201a and the n-type emitter layer 203a and a second main electrode 207b is formed in contact with the p-type base layer 201b and the n-type emitter layer 203b.

In order to turn on the element of this embodiment with the first main electrode 207a set at a low potential and the second main electrode 207b set at a high potential, for example, the channel below the gate electrode 206a on the low potential side is turned on and the channel below the gate electrode 206b on the high potential side is turned off. Thus, the element is turned on based on the principle of a normal thyristor. The element can be turned off by turning on the channel below the gate electrode 206b on the high potential side.

FIG. 25 shows a layout pattern of the whole portion of the IGBT explained with reference to FIG. 21A, 22A or the like. The IGBT is surrounded by a silicon oxide film 300 and therefore the element has a complete dielectric isolation structure. The pattern is made wide on the source side. As shown in the drawing, it is preferable to set the inclination angle of the side surface at approx. 60. With this inclined structure, a depletion layer formed near an n-type base layer 202 becomes short in a portion near the oxide film 300. Therefore, an electric field at the end face is controlled, thereby making it possible to attain a high withstand voltage characteristic.

FIG. 26 shows the construction of a circuit device obtained by combining two IGBTs having the same construction as that of the IGBT shown in FIG. 25. That is, first and second IGBTs are arranged in opposite directions and integrated with the side surfaces thereof set together.

Figure 27:
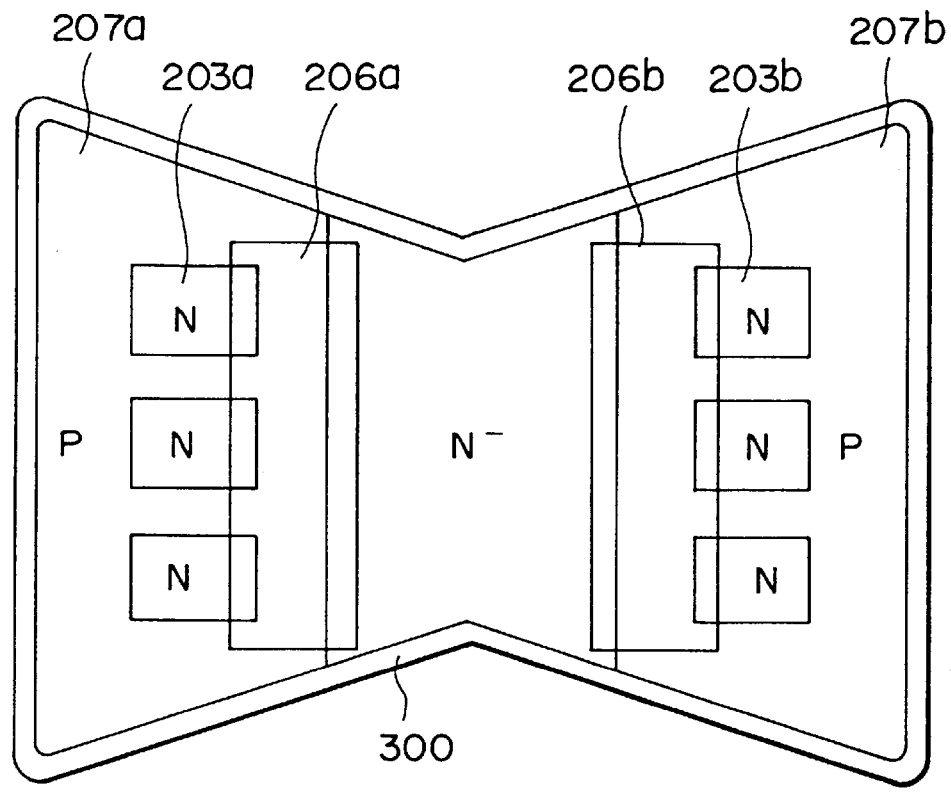
FIG. 27 is a plan view of a bi-directional switching element shown in FIG. 24A.

FIG. 27 shows an example of the layout pattern of the whole portion of the bi-directional switching element shown in FIG. 24. According to this layout pattern, the element has the smallest width in an intermediate portion between the gate electrodes 206a and 206b and the width of the element becomes gradually wider towards the main electrodes 207a and 207b. Also, in this embodiment, the electric field at the end face is controlled so that a high withstand voltage characteristic can be attained.

As described above, according to this invention, a composite integrated circuit device which is particularly useful when used as a power integrated circuit can be obtained by laminating elements in a 3-dimensional fashion.

Next, various types of circuit elements used for the embodiments shown in FIGS. 16 and 17, and formed on the semiconductor element chip 1 or insulatively disposed over a semiconductor substrate are explained.

Figure 28:
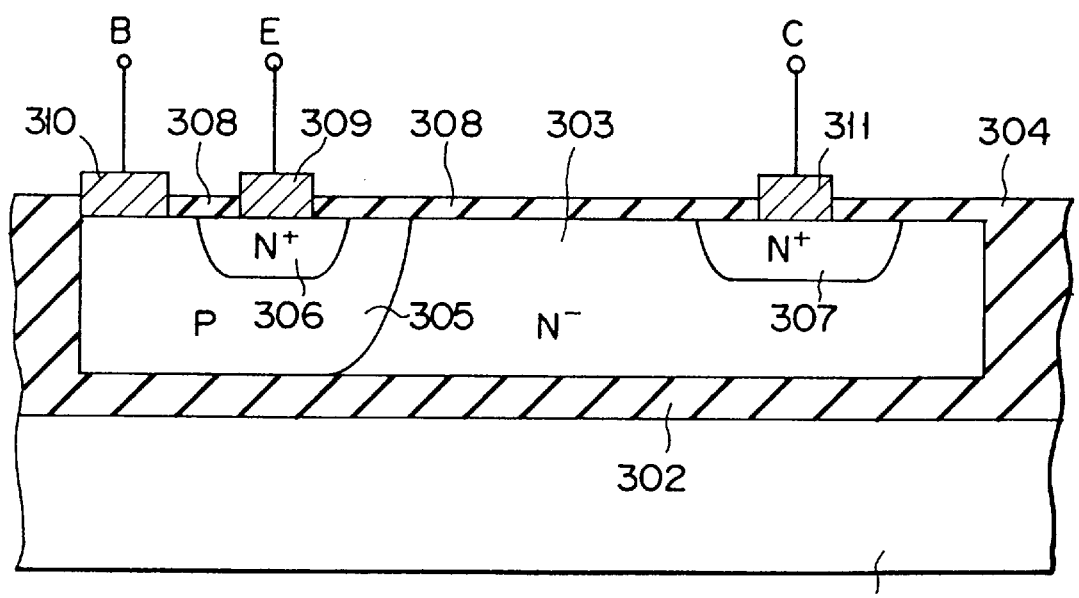
FIG. 28 is a cross sectional view of a first bipolar type semiconductor device formed on a semiconductor element chip.

FIG. 28 shows a first bipolar semiconductor element formed on the semiconductor element chip 1 to constitute a composite integrated circuit device. According to this semiconductor element, a dielectric isolation substrate in which an $n^-$-type silicon active layer 303 used as a collector layer of low impurity concentration is formed over a monocrystalline or polycrystalline silicon substrate 1 with a thick silicon oxide film 302 having a thickness of approx. 1 $\mu$m disposed therebetween as an isolation insulation film. The $n^-$-type silicon active layer 303 is a thin film with a thickness of approx. 2 $\mu$m, for example.

The above dielectric isolation substrate can be obtained by use of an SIMOX method, a direct bonding method of directly bonding two monocrystalline silicon substrates at least one of which has an oxide film formed thereon, a method of depositing polycrystalline silicon over a monocrystalline silicon substrate used as an element region with an insulation film disposed therebetween, or the like.

In this embodiment, the $n^-$-type silicon active layer 303 of the above dielectric isolation substrate is isolated in the lateral direction by the silicon oxide film 304 to form island element regions. A p-type base layer 305 is formed by diffusion in the $n^-$-type silicon active layer 303 of the thus isolated element region and an $n^+$-type collector layer 307 of high impurity concentration is formed by diffusion at a preset distance from the p-type base layer 305. An $n^+$-type emitter layer 306 is formed by diffusion in the p-type base layer 305. The p-type base layer 305 is formed in the active layer 303 with a depth to reach the oxide film 302.

The substrate surface area in which the diffused layers are formed is covered with an oxide film 308, openings are formed in the oxide film 308, and an emitter electrode 309, a base electrode 310 and a collector electrode 311 are partly formed in the respective openings.

According to the above semiconductor element structure, a power element with a high withstand voltage is formed in the $n^-$-type active layer of another island region in the same dielectric isolation substrate and an npn transistor which is electrically isolated from the element can be integrally formed in the semiconductor element chip. For example, the oxide film 304 used for element isolation in the lateral direction may be buried in a groove by use of the CVD method, or may be formed by use of the LOCOS method. In either case, a large occupied area is not necessary if the n-type active layer is as thin as approx. 2 $\mu$m.

Further, in this embodiment, the p-type base layer 305 is formed in the active layer 303 with a depth to reach the oxide film 302. For this reason, when a high reverse bias voltage is applied between the collector and base, all the application voltage in the vertical direction is applied to the oxide film 302. Therefore, a high withstand voltage characteristic can be attained. The withstand voltage in the lateral direction can be made sufficiently high by setting the n-type active layer 303 to have a sufficiently low impurity concentration and adequately setting the distance between the p-type base layer 305 and the n-type collector layer 307.

Further, in this embodiment, since the element is formed as a lateral transistor, carriers are permitted to flow in the entire portion of the n-type active layer 303 in the thickness direction thereof, thereby making it possible to turn on the transistor at a low voltage even when a large current is caused to flow.

The element isolation in the lateral direction can be attained by the pn junction isolation. If the active layer is thin, an occupied area of the isolation region can be made extremely small even when the pn junction isolation is used in the lateral direction and a leak current can be made as small as negligible in comparison with a conventional case wherein the pn junction isolation is used for the whole portion. In this respect, the lateral pn junction isolation can be more effectively used for the structure shown in FIG. 29 and having the active layer thinner than that used in the structure of FIG. 28.

In a semiconductor element described below, the lateral element isolation can be attained by use of a method using a groove, LOCOS method, pn junction isolation method or the like.

Figure 29:
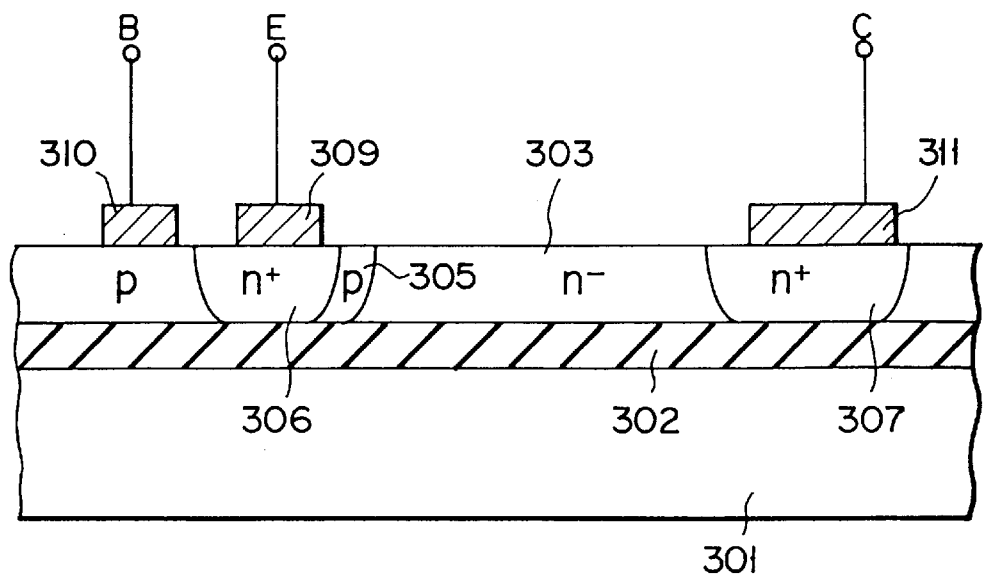
FIG. 29 is a cross sectional view of a second bipolar type semiconductor device formed on a semiconductor element chip.

FIG. 29 shows the structure of a second bipolar transistor. The transistor structure can be obtained by slightly modifying the first transistor structure. That is, an n-type silicon active layer 303 is formed to be thinner than that of the first transistor structure and an n-type emitter layer 306 and an n-type collector layer 307 are formed with a thickness to reach an oxide film 302 formed on the bottom.

Figure 30:
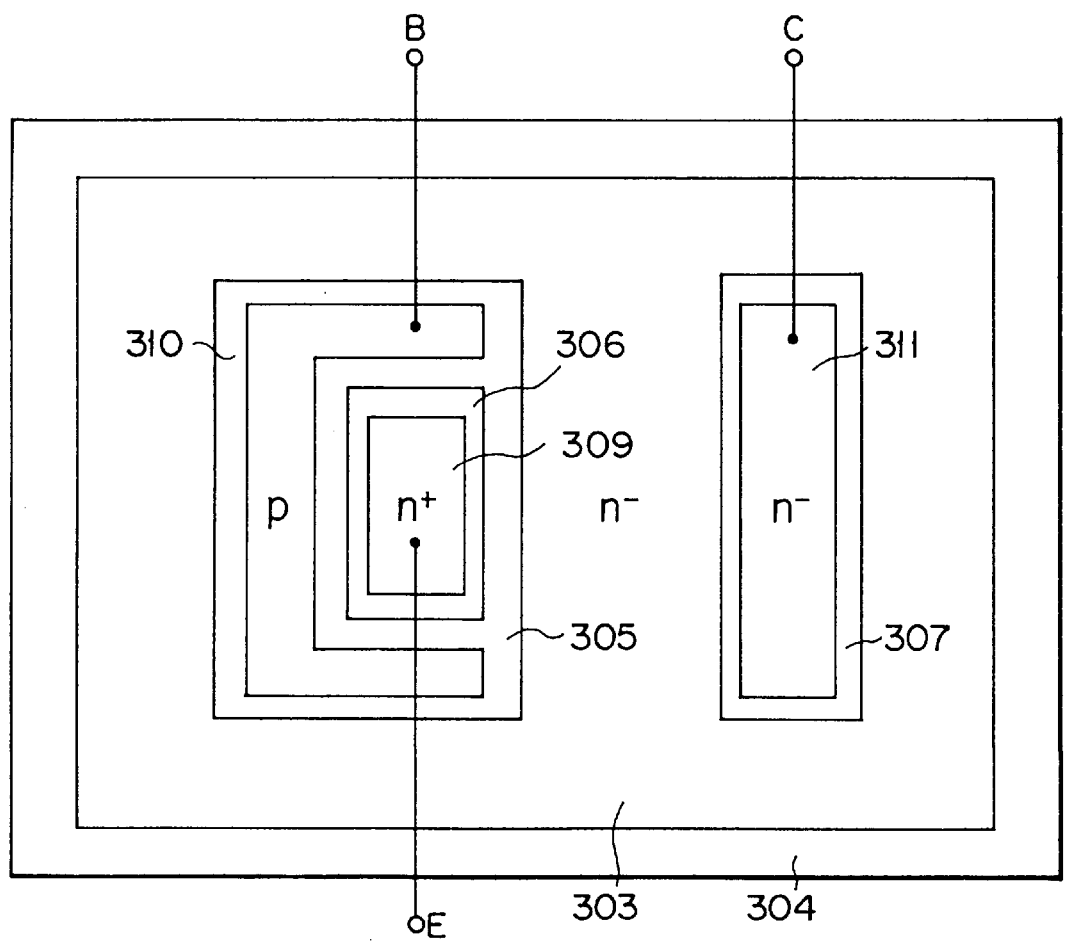
FIG. 30 is a view of a layout of the semiconductor device shown in FIG. 29.

In the cross section of FIG. 29, since the n-type emitter layer 306 is formed in the active layer 303 with a thickness to reach the oxide film 302, a portion of the p-type base layer 305 which is formed in contact with the collector layer and a portion on which a base electrode 310 is formed are shown to be separated from each other, but this will not cause any inconvenience in supplying the base current by using the layout shown in FIG. 30.

As shown in FIG. 30, the n-type emitter layer 306 is formed in the p-type base layer 305 and the base electrode 310 is formed in the form of lateral inversion of "letter C" in which one side facing the collector of the emitter layer 306 is made open so as to surround the three sides of the emitter layer 306.

The layout of FIG. 30 is also effective for the structure of FIG. 28.

FIG. 31 shows a third transistor structure. The transistor structure is a pnp transistor structure, a $p^-$-type silicon active layer 321 having a conductivity type opposite to that of the former transistor structure is used, an n-type base layer 322 is formed in the active layer 321, a $p^+$-type collector layer 324 is formed at a preset distance from the n-type base layer 322, and a $p^+$-type emitter layer 323 is formed in the n-type base layer 322.

FIG. 32 shows a fourth transistor structure. Like the second transistor structure, a $p^-$-type silicon active layer 321 is made thin and a $p^+$-type emitter layer 323 and a $p^+$-type collector layer 324 are formed in the active layer 321 with a depth to reach an oxide film 302.

Also, in the transistor structure of FIG. 32, the same layout as that shown in FIG. 30 becomes necessary.

Figure 33:
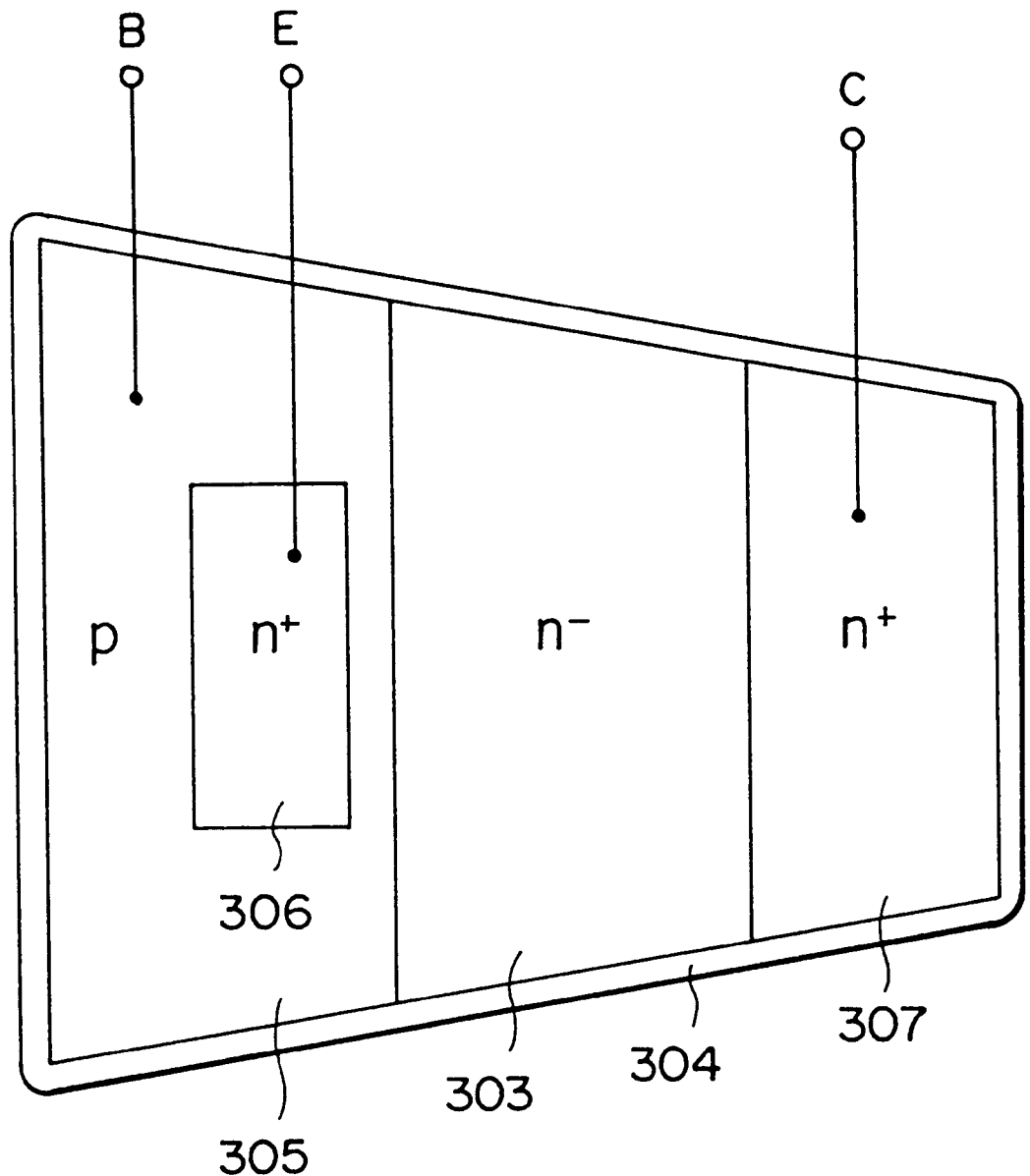
FIG. 33 is a view of a layout of a fifth bipolar type semiconductor device.

FIG. 33 shows the layout of a fifth transistor structure. In this structure, the npn transistor region of the first or second transistor structure is made wider on the emitter side than on the collector side.

According to the above transistor structure, a transistor can be provided in which the concentration of an electric field at the end portion of a depletion layer formed at the time of application of a bias voltage between the collector and the base can be suppressed, thereby attaining a higher withstand voltage characteristic.

Figure 34:
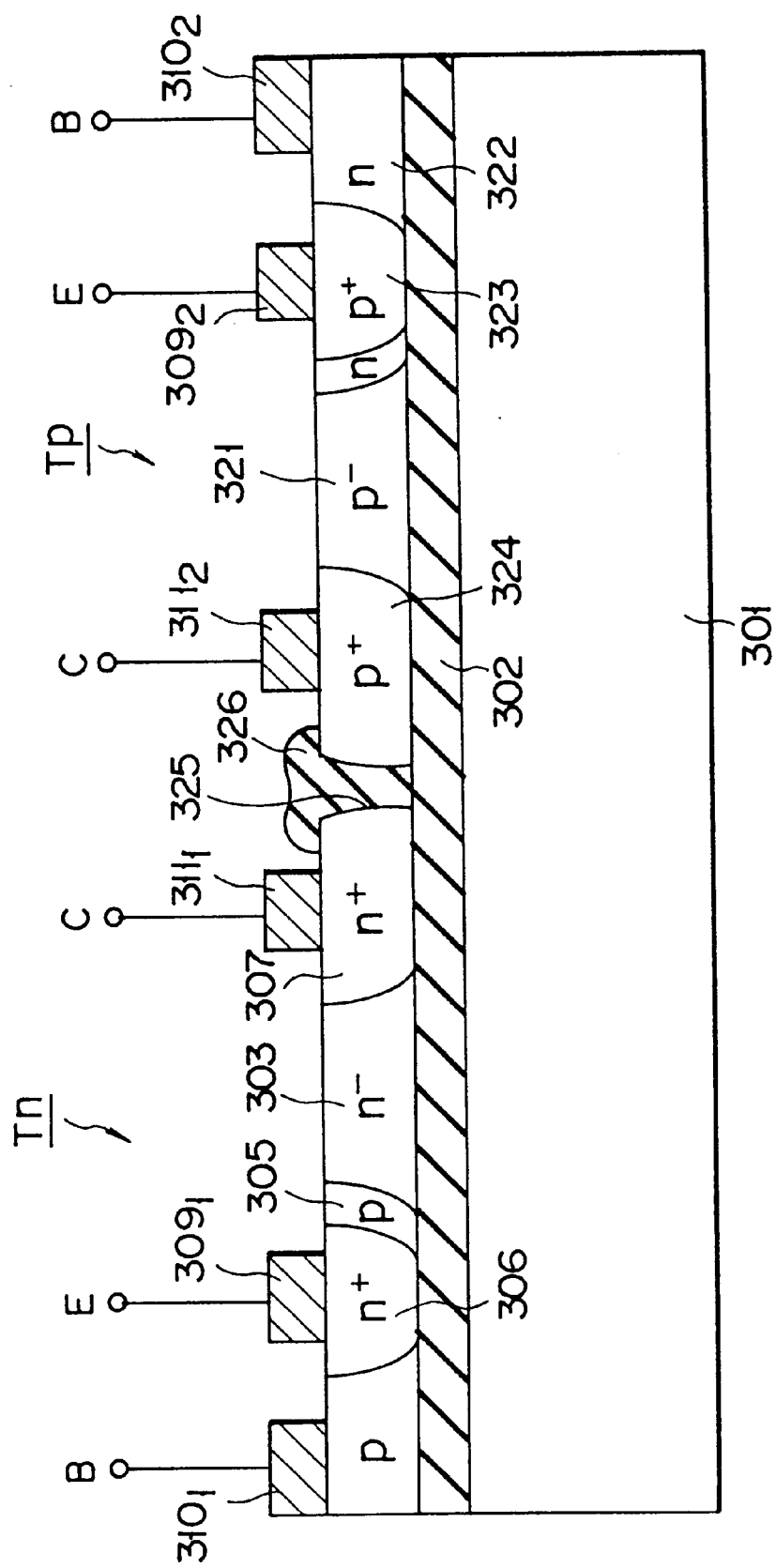
FIG. 34 is a cross sectional view of a sixth bipolar type semiconductor device.

FIG. 34 shows a sixth transistor structure. The transistor structure is an example in which the npn transistor Tn of the second transistor structure and the pnp transistor Tp of the fourth transistor structure are integrated on the same substrate. An n⁻-type silicon layer 303 and a p⁻-type silicon layer 321 in each element region can be formed by doping n-type and/or p-type impurities into a common high-resistance silicon layer. In this example, the silicon layer of each element region is isolated in the lateral direction by a groove 325 which is formed to reach an oxide film 302 on the bottom and a silicon oxide film 326 is buried in the isolation region.

Figure 35:
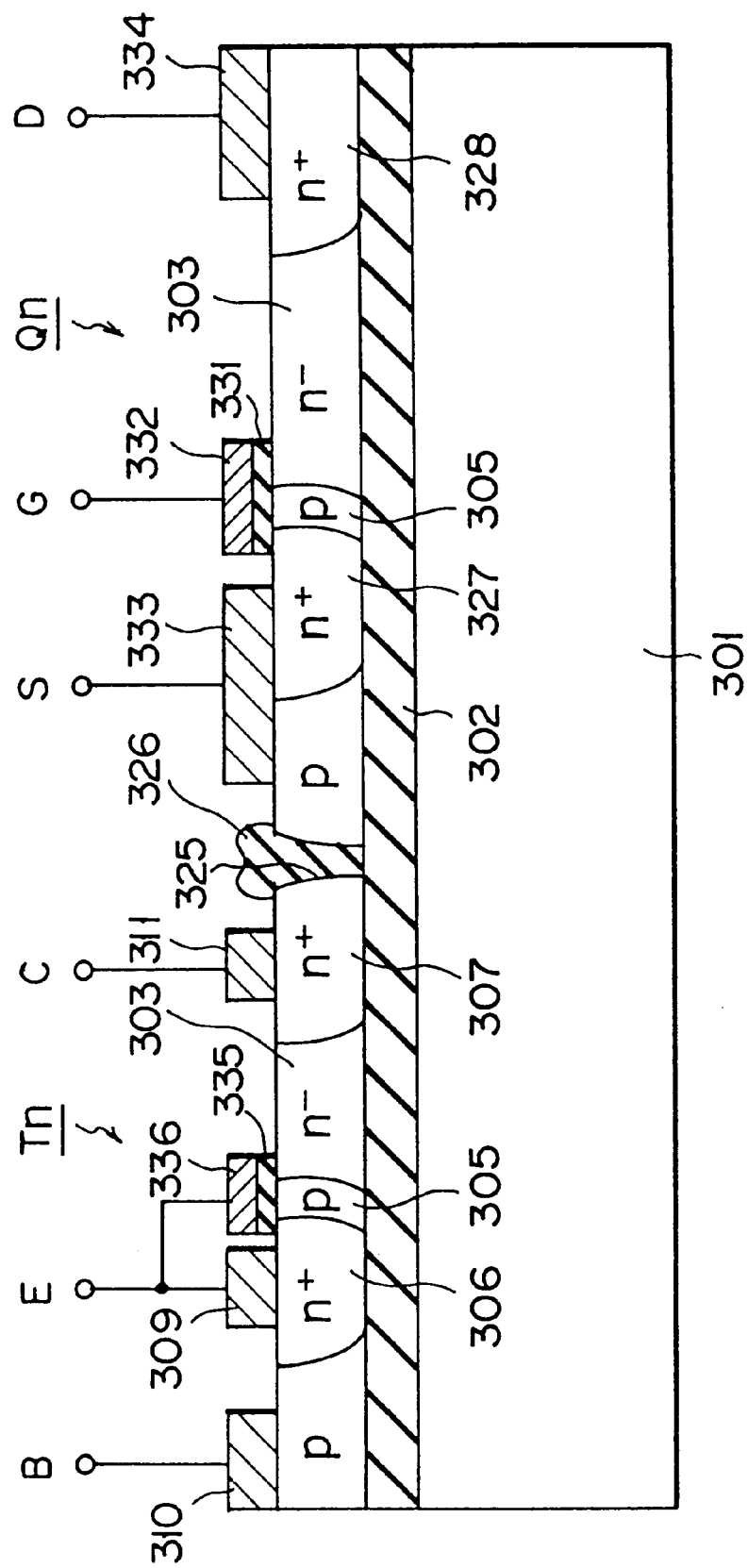
FIG. 35 is a cross sectional view of a seventh bipolar transistor section and a MOS transistor section.

FIG. 35 shows a seventh transistor structure. The transistor structure is an example in which the npn transistor Tn and the n-channel MOS transistor Qn of the second transistor structure are integrated on the same substrate.

In the MOS transistor Qn, a p-type base layer 305 is formed by diffusion in an n⁻-type silicon active layer 303, an n⁺-type source layer 327 is formed by diffusion in the p-type base layer 305, and an n⁺-type drain layer 328 is formed by diffusion at a preset distance from the p-type base layer 305. A polysilicon gate electrode 323 is formed over an area of the p-type base layer 305 which lies between the n⁺-type source layer 327 and the n⁻-type silicon active layer 303 with a gate oxide film 331 disposed therebetween. In the actual manufacturing process, after a gate electrode 332 is formed, a double-diffusion method using the gate electrode 332 as part of a mask is effected to form the p-type base layer 305 and the n-type source layer 327 in the active layer 303.

A source electrode 333 is formed in contact with the n-type source layer 327 and the p⁺-type base layer 306 and a drain electrode 334 is formed in contact with the n-type drain layer 328.

With the above transistor structure, the n-type source layer 327 and the n-type drain layer 328 are formed in contact with the bottom oxide film 302. Therefore, in order to prevent the p-type base layer 305 below the gate electrode 332 from being set into the electrically floating state, it is necessary to form the MOS transistor region with the same diffusion layer layout as that in the example of FIG. 30.

The npn transistor is substantially the same as that of the second example, but a polysilicon electrode 336 is formed over an area of the base layer 305 which lies between the n-type emitter layer 306 and the n-type silicon active layer 303 with an oxide film 335 disposed therebetween. This structure is made to form the p-type base layer 305 and the n-type emitter layer 306 in a self-alignment manner by the double-diffusion method using the polysilicon electrode 336 as part of a mask in the same manner as in the case of formation of the MOS transistor Qn.

The polysilicon electrode 336 is connected to the emitter electrode 309. With this connection, the surface potential of the p-type base layer 305 can be stabilized.

The element isolation structure in the lateral direction is the same as that of the embodiment shown in FIG. 34.

As is clearly seen from the drawing, according to this embodiment, the steps in the process can be commonly used to integrate the bipolar transistor and the MOS transistor.

Further, in FIG. 35, a p-channel MOS transistor which has the same construction as the n-channel MOS transistor Qn and in which the respective regions have conductivity types opposite to those of the n-channel MOS transistor Qn can be easily used instead of the n-channel MOS transistor Qn. Also, the MOS transistor may be of either E (Enhancement) type or D (Depletion) type.

Next, an example which is effective as a low withstand voltage bipolar element having a polysilicon base electrode and formed in the power integrated circuit is explained.

FIG. 36 shows the structure of an eighth low withstand voltage bipolar element. Like the examples described above, a thin high-resistance p⁻-type active layer 321 isolated by an oxide film 302 is formed on a substrate 1, an oxide film 302 for isolation in the lateral direction is formed by the LOCOS method or the like to completely insulatively isolate the whole element region. A base electrode 351 is formed of polycrystalline silicon on the active layer 321. The width of the base electrode 351 is set to be as small as approx. 1 μm. The surface of the base electrode 351 is covered with an oxide film 352 formed by the CVD method and an n-type emitter layer 306 and a collector layer 307 are formed on both sides of the base electrode 351 in the active layer 321 with a depth to reach the bottom oxide film 302.

A method for manufacturing the element of FIG. 36 is explained with reference to FIGS. 37A to 37D.

First, the thin p⁻-type silicon active layer 321 with a thickness of approx. 5 μm is formed over the silicon substrate 1 with the oxide film 302 disposed therebetween. Then, as shown in FIG. 37B, the oxide film 304 for element isolation in the lateral direction is formed by the LOCOS method or the like. A polysilicon film is deposited on the thus isolated element region as shown in FIG. 37C and then patterned to form the base electrode 351. The surface of the base electrode 351 is covered with the oxide film 352. After this, phosphorus or arsenic is ion-implanted into the active layer 321 and diffused to form the emitter layer and collector layer 307 which are self-aligned with the base electrode 351.

According to the above method, a bipolar transistor having the emitter and collector which are self-aligned with the base electrode can be formed in the insulatively isolated thin active layer. An element having a low withstand voltage and excellent in the frequency characteristic can be obtained by setting the width of the base electrode 341 to 1 μm or less.

FIG. 38 shows a ninth bipolar transistor structure obtained by modifying the transistor structure of FIG. 36. In this example, a p-type base layer 353 is formed between an active layer 321 lying below the base electrode 351 and an emitter layer 306.

FIG. 39 shows a tenth bipolar transistor structure obtained by further modifying the transistor structure of FIG. 38. In this example, an n-type active layer 303 is used instead of the p⁻-type active layer 321.

Figure 40:
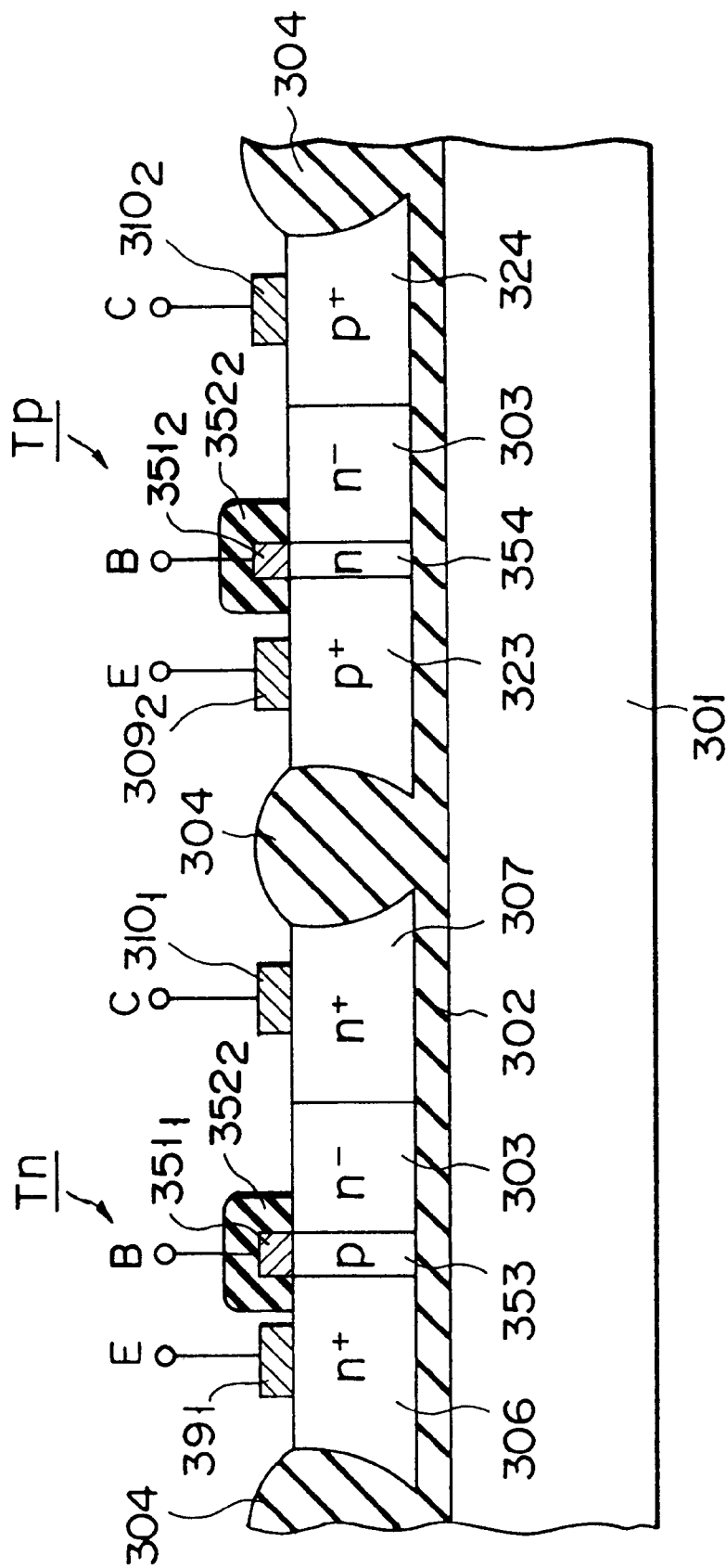
FIG. 40 is a cross sectional view of a semiconductor device having an npn transistor and a pnp transistor integrated therein.

FIG. 40 shows a semiconductor device having an npn transistor Tn and a pnp transistor Tp which are insulatively isolated from each other and are integrated on the same substrate.

As described above, in a lateral bipolar transistor having a polysilicon base electrode, the base electrode is formed in contact with the active layer and the same base electrode structure can also be used for the first to tenth transistor structures described before.

According to the semiconductor structures shown in FIGS. 28 to 40, a bipolar type semiconductor device which has an insulatively isolated thin active layer suitable for integration together with a high withstand voltage element and in which the area of the isolated region is small and an excellent isolation characteristic can be attained can be provided.

What is claimed is:

1. An integrated circuit device comprising:

a semiconductor substrate;

an active layer insulatively disposed over said semiconductor substrate;

a lateral bipolar transistor fabricated in said active layer, said lateral bipolar transistor comprising, a first base layer which is formed in said active layer, an emitter layer which is formed in said first base layer and surrounded thereby, and a collector layer which is formed in said active layer on a lateral side of said first base layer surrounding the emitter layer with said collector layer said active layer and said base layer being located side by side;

a MOS transistor fabricated in said active layer, said MOS transistor comprising, a second base layer which is formed in said active layer, a source layer which is formed in said second base layer and surrounded thereby, a drain layer which is formed in said active layer on a lateral side of said second base layer with said drain layer, said active layer and said second base layer being located side by side, and a gate electrode insulatively disposed over said second base layer between said source layer and said drain layer; and an isolation layer formed in said active layer by a LOCOS method for separating said bipolar transistor and said MOS transistor from each other.

2. An integrated circuit device comprising:

a semiconductor substrate;

an active layer of a first conductivity type insulatively disposed over said semiconductor substrate;

a lateral bipolar transistor fabricated in said active layer, said lateral bipolar transistor comprising, a first base layer of a second conductivity type which is formed in said active layer, an emitter layer of the first conductivity type which is formed in said first base layer and surrounded thereby, and a collector layer of the first conductivity type which is formed in said active layer on a lateral side of said first base layer surrounding the emitter layer with said collector layer, said active layer and said base layer being located side by side;

a MOS transistor fabricated in said active layer, said MOS transistor comprising, a second base layer of the second conductivity type which is formed in said active layer, a source layer of the first conductivity type which is formed in said second base layer and surrounded thereby, a drain layer of the first conductivity type which is formed in said active layer on a lateral side of said second base layer with said drain layer said active layer and said second base layer being located side by side, and a gate electrode insulatively disposed over said second base layer between said source layer and said drain layer; and an isolation layer formed in said active layer by a LOCOS method for separating said bipolar transistor and said MOS transistor from each other.

3. An integrated circuit device according to claim 2, which includes a bottom insulation layer formed between a bottom of said active layer and said semiconductor substrate and wherein said emitter layer and said collector layer are formed with a depth to reach the bottom insulation layer.

4. An integrated circuit device according to claim 2, wherein said MOS transistor comprises a p-channel MOS transistor.

5. An integrated circuit device comprising:

a semiconductor substrate;

an active layer insulatively disposed over said semiconductor substrate;

a lateral bipolar transistor fabricated in said active layer, said lateral bipolar transistor comprising, a first base layer which is formed in said active layer, an emitter layer which is formed in said first base layer and surrounded thereby, and a collector layer which is formed in said active layer on a lateral side of said first base layer surrounding the emitter layer; and a MOS transistor fabricated in said active layer, said MOS transistor comprising, a second base layer which is formed in said active layer, a source layer which is formed in said second base layer and surrounded thereby, a drain layer which is formed in said active layer on a lateral side of said second base layer, and a gate electrode insulatively disposed over said second base layer between said source layer and said drain layer.

6. The integrated circuit device according to claim 5, wherein said bipolar transistor is electrically isolated from said MOS transistor.

7. The integrated circuit device according to claim 5, wherein an isolation layer is formed in said active layer by a LOCOS method for separating said bipolar transistor and said MOS transistor from each other.

8. The integrated circuit device according to claim 5, wherein said emitter layer and said collector layer are separated from bottoms of said first base layer and said active layer, respectively.

9. An integrated circuit device comprising:

a semiconductor substrate;

an insulation layer formed on said semiconductor substrate;

an active layer of a first conductivity type which is formed directly on said insulation layer so as to reach said insulation layer;

a lateral bipolar translator fabricated in said active layer, said lateral bipolar transistor comprising, a base layer of a second conductivity type which is formed in said active layer, an emitter layer of the first conductivity type which is formed in said base layer, a collector layer of the first conductivity type which is formed in said active layer and separated from a bottom of said active layer, and a MOS transistor fabricated in said active layer, said MOS transistor comprising, a second base layer which is formed in aid active layer, a source layer which is formed in said second base layer and surrounded thereby, a drain layer which is formed in said active layer on a lateral side of said first base layer, and a gate electrode insulatively disposed over said second base layer between said source layer and said drain layer.

10. The integrated circuit device according to claim 9, wherein the base layer is formed so as to reach the insulation layer.

11. The integrated circuit device according to claim 9, wherein the active layer has an impurity concentration lower than that of the collector layer.

12. The integrated circuit device according to claim 9, wherein the lateral transistor is an npn transistor.

13. The integrated circuit device according to claim 9, wherein the lateral transistor is a pnp transistor.

14. The semiconductor device according to claim 9, which comprises a MOS transistor fabricated in said active layer.

15. The integrated circuit device according to claim 14, wherein said bipolar transistor is dielectrically isolated from another element fabricated in said active layer.

16. The integrated circuit device according to claim 15, comprising an isolation layer formed in said active layer by a LOCOS method and configured to separate said bipolar transistor and said another element from each other.

* * * * *

UNITED STATES PATENT AND TRADEMARK OFFICE
CERTIFICATE OF CORRECTION

PATENT NO. : 5,994,739
DATED : November 30, 1999
INVENTOR(S) : NAKAGAWA ET AL

It is certified that error appears in the above-identified patent and that said Letters Patent is hereby corrected as shown below:

Column 18, last line, change "aid" to --said--.

Column 19, line 4, change "first" to --second--.

Signed and Sealed this

Twenty-ninth Day of May, 2001

*Attest:*

NICHOLAS P. GODICI

*Attesting Officer*     *Acting Director of the United States Patent and Trademark Office*